(12) United States Patent
Adel et al.

(10) Patent No.: US 7,804,994 B2
(45) Date of Patent: Sep. 28, 2010

(54) OVERLAY METROLOGY AND CONTROL METHOD

(75) Inventors: Michael Adel, Zichron Ya'akov (IL); Mark Ghinovker, Migdal Haemek (IL); Elyakim Kassel, D.N. Misgav (IL); Boris Golovanevsky, Haifa (IL); John C. Robinson, Austin, TX (US); Chris A. Mack, Austin, TX (US); Jorge Poplawski, Haifa (IL); Pavel Izikson, Haifa (IL); Moshe Preil, Sunnyvale, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 1282 days.

(21) Appl. No.: 10/367,124

(22) Filed: Feb. 13, 2003

(65) Prior Publication Data
US 2003/0223630 A1   Dec. 4, 2003

Related U.S. Application Data

(60) Provisional application No. 60/357,390, filed on Feb. 15, 2002, provisional application No. 60/419,786, filed on Oct. 17, 2002, provisional application No. 60/435,878, filed on Dec. 19, 2002.

(51) Int. Cl.
*G06K 9/00* (2006.01)
(52) U.S. Cl. .................. 382/151; 382/145; 430/22; 430/30; 356/399; 356/401
(58) Field of Classification Search ......... 382/141–151; 430/22, 30; 356/399–401
See application file for complete search history.

(56) References Cited

U.S. PATENT DOCUMENTS

| 4,251,160 A | 2/1981 | Bouwhuis et al. |
| 4,475,811 A | 10/1984 | Brunner |
| 4,538,105 A | 8/1985 | Ausschnitt |

(Continued)

FOREIGN PATENT DOCUMENTS

EP            0818814            1/1998

(Continued)

OTHER PUBLICATIONS

Dirksen, et al., "Novel aberration monitor for optical lithography", Part of the SPIE Conference on Optical Microlithography XII, Santa Clara, CA Mar. 1999, SPIE vol. 3676, p. 77-86.

(Continued)

*Primary Examiner*—Matthew C Bella
*Assistant Examiner*—Eric Rush
(74) *Attorney, Agent, or Firm*—Weaver Austin Villeneuve & Sampson LLP

(57) ABSTRACT

An overlay method for determining the overlay error of a device structure formed during semiconductor processing is disclosed. The overlay method includes producing calibration data that contains overlay information relating the overlay error of a first target at a first location to the overlay error of a second target at a second location for a given set of process conditions. The overlay method also includes producing production data that contains overlay information associated with a production target formed with the device structure. The overlay method further includes correcting the overlay error of the production target based on the calibration data.

16 Claims, 21 Drawing Sheets

U.S. PATENT DOCUMENTS

| | | | |
|---|---|---|---|
| 4,703,434 A | 10/1987 | Brunner | |
| 4,714,874 A | 12/1987 | Morris et al. | |
| 4,757,207 A | 7/1988 | Chappelow et al. | |
| 4,757,707 A | 7/1988 | Harvey et al. | |
| 4,778,275 A | 10/1988 | van den Brink et al. | |
| 4,782,288 A | 11/1988 | Vento | |
| 4,820,055 A | 4/1989 | Müller | |
| 4,855,253 A | 8/1989 | Weber | |
| 4,929,083 A | 5/1990 | Brunner | |
| 5,017,514 A | 5/1991 | Nishimoto | |
| 5,100,237 A | 3/1992 | Wittekoek et al. | |
| 5,112,129 A | 5/1992 | Davidson et al. | |
| 5,148,214 A | 9/1992 | Ohta et al. | |
| 5,156,982 A | 10/1992 | Nagoya | |
| 5,172,190 A | 12/1992 | Kaiser | |
| 5,216,257 A | 6/1993 | Brueck et al. | |
| 5,262,258 A | 11/1993 | Yanagisawa | |
| 5,296,917 A | 3/1994 | Kusonose et al. | |
| 5,383,136 A | 1/1995 | Cresswell et al. | |
| 5,414,514 A | 5/1995 | Smith et al. | |
| 5,436,097 A | 7/1995 | Norishima et al. | |
| 5,438,413 A | 8/1995 | Mazor et al. | |
| 5,477,057 A | 12/1995 | Angeley et al. | |
| 5,479,270 A | 12/1995 | Taylor | |
| 5,481,362 A | 1/1996 | Van Den Brink et al. | |
| 5,498,501 A | 3/1996 | Shimoda et al. | |
| 5,596,413 A | 1/1997 | Stanton et al. | |
| 5,604,819 A | 2/1997 | Barnard | |
| 5,617,340 A | 4/1997 | Cresswell et al. | |
| 5,627,083 A * | 5/1997 | Tounai | 438/18 |
| 5,665,495 A | 9/1997 | Hwang | |
| 5,674,650 A * | 10/1997 | Dirksen et al. | 430/22 |
| 5,699,282 A | 12/1997 | Allen et al. | |
| 5,701,013 A | 12/1997 | Hsia et al. | |
| 5,702,567 A | 12/1997 | Mitsui et al. | |
| 5,703,685 A | 12/1997 | Senda et al. | |
| 5,712,707 A | 1/1998 | Ausschnitt et al. | |
| 5,757,507 A | 5/1998 | Ausschnitt et al. | |
| 5,766,809 A | 6/1998 | Bae | |
| 5,783,342 A | 7/1998 | Yamashita et al. | |
| 5,805,290 A | 9/1998 | Ausschnitt et al. | |
| 5,835,196 A | 11/1998 | Jackson | |
| 5,857,258 A | 1/1999 | Penzes et al. | |
| 5,863,680 A * | 1/1999 | Kawakubo et al. | 430/22 |
| 5,872,042 A | 2/1999 | Hsu et al. | |
| 5,877,036 A | 3/1999 | Kawai | |
| 5,877,861 A | 3/1999 | Ausschnitt et al. | |
| 5,902,703 A | 5/1999 | Leroux et al. | |
| 5,912,983 A | 6/1999 | Hiratsuka | |
| 5,923,041 A | 7/1999 | Cresswell et al. | |
| 5,939,226 A * | 8/1999 | Tomimatu | 430/5 |
| 5,949,145 A | 9/1999 | Komuro | |
| 5,952,134 A | 9/1999 | Hwang | |
| 5,960,125 A | 9/1999 | Michael et al. | |
| 5,968,693 A | 10/1999 | Adams | |
| 6,020,966 A | 2/2000 | Ausschnitt et al. | |
| 6,023,338 A | 2/2000 | Bareket | |
| 6,037,671 A | 3/2000 | Kepler et al. | |
| 6,061,606 A | 5/2000 | Ross | |
| 6,077,756 A | 6/2000 | Lin et al. | |
| 6,079,256 A | 6/2000 | Bareket | |
| 6,084,679 A | 7/2000 | Steffan et al. | |
| 6,118,185 A | 9/2000 | Chen et al. | |
| 6,128,089 A | 10/2000 | Ausschnitt et al. | |
| 6,130,750 A | 10/2000 | Ausschnitt et al. | |
| 6,137,578 A | 10/2000 | Ausschnitt | |
| 6,140,217 A | 10/2000 | Jones et al. | |
| 6,146,910 A | 11/2000 | Cresswell et al. | |
| 6,160,622 A | 12/2000 | Dirksen et al. | |
| 6,165,656 A | 12/2000 | Tomimatu | |
| 6,384,899 B1 | 5/2002 | den Boef | |
| 6,405,096 B1 * | 6/2002 | Toprac et al. | 700/121 |
| 6,462,818 B1 | 10/2002 | Bareket | |
| 6,612,159 B1 * | 9/2003 | Knutrud | 73/105 |
| 6,664,121 B2 | 12/2003 | Grodnensky et al. | |
| 6,675,053 B2 * | 1/2004 | Baluswamy et al. | 700/58 |
| 6,686,107 B2 * | 2/2004 | Matsumoto et al. | 430/22 |
| 6,690,021 B2 | 2/2004 | Sohn | |
| 6,734,549 B2 | 5/2004 | Takeoka et al. | |
| 6,734,971 B2 | 5/2004 | Smith et al. | |
| 6,753,120 B2 | 6/2004 | Kim | |
| 6,921,916 B2 | 7/2005 | Adel et al. | |
| 6,937,344 B2 | 8/2005 | Monshower et al. | |
| 6,985,618 B2 | 1/2006 | Adel et al. | |
| 7,346,878 B1 | 3/2008 | Cohen et al. | |
| 7,608,468 B1 | 10/2009 | Ghinovker et al. | |
| 2001/0055720 A1 * | 12/2001 | Sato et al. | 430/5 |
| 2003/0021465 A1 | 1/2003 | Adel et al. | |
| 2003/0021466 A1 | 1/2003 | Adel et al. | |
| 2003/0021467 A1 | 1/2003 | Adel et al. | |
| 2003/0026471 A1 | 2/2003 | Adel et al. | |
| 2003/0102440 A1 | 6/2003 | Sohn | |
| 2005/0173634 A1 | 8/2005 | Wong et al. | |
| 2006/0039595 A1 | 2/2006 | Adel et al. | |
| 2006/0177120 A1 | 8/2006 | Ghinovker et al. | |
| 2006/0204073 A1 | 9/2006 | Ghinovker et al. | |

FOREIGN PATENT DOCUMENTS

| | | |
|---|---|---|
| EP | 0947828 | 10/1999 |
| JP | 02051214 A2 | 2/1990 |
| JP | 07045495 A2 | 2/1995 |
| JP | 09244222 A2 | 9/1997 |
| JP | 200306793 A2 | 11/2000 |

OTHER PUBLICATIONS

Farrar et al., "In-situ measurement of lens aberrations", Mar. 2000 Proceedings of SPIE Vo. 4000, Optical Microlithography XIII.

Levinson et al., "Minimization of Total Overlay Errors on Product Wafers Using an Advanced Optimization Scheme", SPIE vol. 3051 (1997) p. 362-373.

Normura, "Measurement of Wave-Front Aberrations in Lithography Lenses with an Overlay Inspection Tool", Optical Review No. 8, vol. 4 (2001) p. 227-234.

Levinson, "Lithography Process Control", Tutorial Texts in Optical Engineering, vol. TT28, Chapter 5, pp. 96-107.

Rivera et al., "Overlay Performance on Tungsten CMP Layers Using the ATHENA Alignment System".

Hsu et al., "Characterizing lens distortion to overlay accuracy by using fine measurement pattern", Mar. 1999, SPIE vol. 3677.

Office Action Mailed May 5, 2006 from U.S. Appl. No. 11/179,819.

Office Action Mailed Aug. 21, 2007 from U.S. Appl. No. 11/179,819.

Notice of Allowance Mailed Nov. 19, 2007 from U.S. Appl. No. 11/179,819.

Japanese Office Action dated Mar. 3, 2009 in Patent Application No. 2003-570292.

Bishop et al, "The OMAG3 Reticle Set," Jul. 31, 2003, International SEMATECH, Technology Transfer #3074417A-ENG, pp. 1-26.

Ghinovker, et al., "Overlay Marks, Methods of Overlay Mark Design and Methods of Overlay Measurements", U.S. Appl. No. 09/894,987, filed Jun. 27, 2001.

US Office Action dated Jan. 3, 2007 in U.S. Appl. No. 10/858,836.

Notice of Allowance dated Sep. 5, 2007 in U.S. Appl. No. 10/858,836.

Notice of Allowance dated Nov. 21, 2007 in U.S. Appl. No. 10/858,836.

Notice of Allowance dated Dec. 13, 2007 in U.S. Appl. No. 10/858,836.

Office Action mailed Mar. 30, 2007 in U.S. Appl. No. 10/950,172.

US Office Action dated Oct. 10, 2006 from U.S. Appl. No. 10/950,172.

U.S. Office Action mailed Sep. 25, 2007 in U.S. Appl. No. 10/950,172.
Office Action mailed Mar. 20, 2008 in U.S. Appl. No. 10/950,172.
U.S. Office Action mailed Jun. 27, 2008 in U.S. Appl. No. 10/950,172.
U.S. Office Action mailed Dec. 22, 2008 in U.S. Appl. No. 10/950,172.
Notice of Allowance mailed Jun. 25, 2009 in U.S. Appl. No. 10/950,172.
Supplemental Notice of Allowance dated Jul. 20, 2009 in U.S. Appl. No. 10/950,172.
Allowed claims from U.S. Appl. No. 10/950,172.
International Search Report from PCT application No. PCT/US03/04471, dated May 22, 2003.
US 5,841,144, 11/1998, Cresswell (withdrawn)

* cited by examiner

Total OMF for box in box and grating targets.

Reticle OMF on a wafer by wafer basis for box in box and grating targets.

Random (process) OMF, on a wafer by wafer basis for box in box and grating targets.

OVERLAY METROLOGY AND CONTROL METHOD

CROSS REFERENCE TO RELATED APPLICATIONS

This application claims the priority of U.S. Provisional No. 60/357,390 titled, "OVERLAY METROLOGY", filed on Feb. 15, 2002, U.S. Provisional No. 60/419,786 titled, "OVERLAY METROLOGY", filed on Oct. 17, 2002, and U.S. Provisional No. 60/435,878 titled, "METHOD OF DETERMINING THE FIDELITY OR ROBUSTNESS OF AN OVERLAY MARK", filed on Dec. 19, 2002, all of which are hereby incorporated by reference.

This application is related to U.S. patent application Ser. No. 09/894,987 to Ghinovker et al., titled "OVERLAY MARKS, METHODS OF OVERLAY MARK DESIGN AND METHODS OF OVERLAY MEASUREMENTS", filed on Jun. 27, 2001, and which is hereby incorporated by reference.

FIELD OF THE INVENTION

The invention relates to a method of carrying out overlay metrology and control as a "use case".

BACKGROUND OF THE INVENTION

Lithography tools used in the manufacture of integrated circuits have been around for some time. Such tools have proven extremely effective in the precise manufacturing and formation of very small details in the product. In most lithography tools, a circuit image is written on a substrate by transferring a pattern via a light beam. For example, the lithography tool may include a light source that projects a circuit image through a reticle and onto a silicon wafer coated with photoresist. The exposed photoresist typically forms a pattern that masks the layers of the wafer during subsequent processing steps, as for example deposition and/or etching. As is generally well known, materials are deposited onto the layers of the wafer during deposition and materials are selectively removed from the layers of the wafer during etching.

The measurement of overlay between successive patterned layers on a wafer is one of the most critical process control techniques used in the manufacturing of integrated circuits and devices. Overlay generally pertains to the determination of how accurately a first patterned layer aligns with respect to a second patterned layer disposed above or below it. Presently, overlay measurements are performed via targets that are printed together with layers of the wafer. The most commonly used overlay target pattern is the "Box-in-Box" target, which includes a pair of concentric squares (or boxes) that are formed on successive layers of the wafer. The overlay error is generally determined by comparing the position of one square relative to the other square. This may be accomplished with an overlay metrology tool that measures the relative displacement between the two squares.

To facilitate discussion, FIG. 1 is a top view of a typical "Box-in-Box" target 2. As shown, the target 2 includes an inner box 4 disposed within an open-centered outer box 6. The inner box 4 is printed on the top layer of the wafer while the outer box 6 is printed on the layer directly below the top layer of the wafer. As is generally well known, the overlay error between the two boxes, along the x-axis for example, is determined by calculating the locations of the edges of lines c1 and c2 of the outer box 6, and the edge locations of the lines c3 and c4 of the inner box 4, and then comparing the average separation between lines c1 and c3 with the average separation between lines c2 and c4. Half of the difference between the average separations c1&c3 and c2&c4 is the overlay error (along the x-axis) at that point. Thus, if the average spacing between lines c1 and c3 is the same as the average spacing between lines c2 and c4, the corresponding overlay error tends to be zero. Although not described, the overlay error between the two boxes along the y-axis may also be determined using the above technique.

Most overlay measurements are performed immediately after the photoresist is developed, i.e., the photoresist is developed away in the area where it was exposed to the light thus leaving the overlay pattern in the photoresist. In some cases, the overlay measurements are used to correct the process in order to keep the overlay errors within desired limits. For example, the overlay measurements may be fed into an analysis routine that calculates correctables and other statistics, which are used by the operator and/or the lithography tool to get the tool better aligned thus allowing wafer processing to proceed within desired limits. If the overlay error is too great, the analysis results may indicate that the wafer needs to be reworked, i.e., strip or remove the resist and start over on that layer. Reworking is typically expensive and undesirable, but it is better than scrapping the wafer all together. Overlay measurements can also be performed after process steps such as etch, when no photoresist is present. In this case, reworking is not possible, but the added information aids in the finer tuning of the overall process.

A typical semiconductor process includes wafer processing by lot. A lot is a group of typically 25 wafers which are processed together. Each wafer in the lot is comprised of many exposure fields from the lithography processing tools (e.g. steppers, scanners, etc.). Within each exposure field can be typically 1 to many die. A die is the functional unit which eventually becomes a single chip. On product wafers, overlay metrology marks are typically placed in the scribeline area (for example in the 4 corners of the field). This is a region that is typically free of circuitry around the perimeter of the exposure field (and outside the die). Sometimes overlay targets are placed in the streets, which are regions between the die but not at the perimeter of the field. It is fairly rare for overlay targets to be placed on product wafers within the prime die areas, as this area is critically needed for circuitry. Engineering and characterization wafers (not production wafers), however, typically have many overlay targets throughout the center of the field where no such limitations are involved. Because of the spatial separation between the "scribe-line" metrology marks and the prime die circuitry, there occur discrepancies between what is measured and what needs to be optimized on product wafers. Advances in both the scribe-line metrology marks and in their interpretation are required.

Unfortunately, the lithography tool's optical characteristics have a strong influence on overlay and critical dimension performance when patterning advanced design rule integrated circuits. Of particular importance are the optical aberrations of the lithographic lens system. Many examples exist today of methods used to quantitatively measure these optical aberrations. Three examples of these, each based on slightly different physical principles are the Litel reticle concept described in, "In Situ Measurement of Lens Aberrations", N. R. Farrar, Hewlet-Packard Co.; A. H. Smith, Litel Instruments; D. R. Busath, KLA-Tencor Corp. [4000-03], March 2000, Proceedings of SPIE Vol. 4000, Optical Microlithography XIII; the Artemis concept described in SPIE vol. 3679 (1999) p. 77-86 "Novel Aberration Monitor for Optical Lithography" Peter Dirksen et al.; and the phase shift grating concept described in Optical Review No. 8 Vol. 4 (2001) p.

227-234 "Measurement of Wavefront Aberrations in Lithographic Lenses with an Optical Inspection Tool," Hiroshi Nomura. In each case the output of the analysis tool are typically provided in terms of Zernike polynomial coefficients, which can accurately describe the induced phase error across the exit pupil of the lithographic lens in a form which can be easily interpreted in optically meaningful terms such as spherical, astigmatic and coma aberrations.

Although these aberration descriptors are generally accepted as quantitative metrics for the quality of lens systems, it is a non-trivial problem to quantitatively estimate the impact they will have on overlay, or more specifically the pattern placement error. Such calculations require detailed knowledge of other process parameters such as the exposure tool illumination configuration, wavelength, numerical aperture and the geometry of the pattern. In conventional overlay metrology using box in box targets as is common today, the impact of the exposure tool's optical aberrations on the accuracy of the metrology and the proper use of these metrology results for the purpose of overlay control is not taken into account at all.

Traditional overlay targets are characterized by large open areas and large feature sizes, which is very different than the transistors that they are trying to represent. Today's semiconductor processes are designed to optimize the transistors and circuitry feature sizes and pitches only. Therefore traditional overlay marks are not sensitive to the same aberrations as the transistors.

There have been recent disclosures, however, which attempt to deal with this issue by making box in box targets, which are more device representing (or device like) and process-robust. For ease of discussion "device representing" targets may be defined as a target that is sensitive to the same aberrations as a particular size and pitch of the transistor. Large open spaces are also subject to the adverse effects of other process areas (besides lithography), such as CMP polish and deposition. Further, "process-robust" targets may be defined as targets that are not adversely affected by these spurious processes. It should be noted that these two terms are defined in greater detail in the description of the invention.

By way of example, the "Box in Box" target has been modified to form a "Box in Bar" target and the "Bar in Bar" target. Both of these targets have the same general appearance as the "Box in Box" target. In "Box in Bar" targets, the outer box of the "Box in Box" target is separated into a plurality of parallel bars. In "Bar in Bar" targets, both the outer and inner box of the "Box in Box" target are separated into a plurality of parallel bars. More recently, there has been the introduction of separated bars that created features comparable to the design rules of the integrated circuit. See for example U.S. Patent Publication 2001 0055720 by Sato et al. While this method shows some potential in reducing the discrepancy between box in box scribeline structures and the overlay at the device structure itself, it still suffers from several short comings.

For one, the targets are typically limited in number and to specific places on the wafer and therefore they cannot compensate for the fact that the aberrations of the lithography tool vary across the exposure field. As should be appreciated, the available space on the wafer is severely restricted due to the fact that the real estate thereon is so expensive, i.e., most of the space on the wafer is reserved for dies. In most cases, the targets are spatially located in the scribeline at the perimeter of the exposure field, i.e., it is the space between the dies used for dicing the dies from the wafer. Furthermore, the number of targets in the scribeline is typically limited to four, one at each corner of the field. As should be appreciated, it is difficult to accurately determine how the overlay is behaving across the field (e.g. in the middle of the field) if only four places at the periphery of the field are sampled, i.e., if you only measure the four corners of the field, you have no knowledge of any other points. That is, overlay measurements carried at peripheral locations such as the scribeline do not necessarily represent the true overlay of the device features within the die since the aberrations of the lens vary across the exposure field of the lithography tool. By way of example, see SPIE vol. 3051 (1997) p. 362-373 "Minimization of Total Overlay Errors on Product Wafers Using an Advanced Optimization Scheme" Harry J. Levinson et al.

In addition, the targets are typically not optimized for the process and therefore the fine structures of the targets may suffer from process induced biases when measured by the metrology tool. As should be appreciated, each time a new process is introduced in microelectronic manufacture, there is some impact on the target. The ability to measure the target depends on it's visibility or contrast in the image acquisition microscope of the metrology tool. Some processes such as metallization by sputtering tend to diminish contrast, hence impacting precision. Other processes such as chemical mechanical polishing (CMP) tend to blur or distort the targets, hence impacting accuracy. These processes may also make the target features asymmetric or create an apparent spatial translation of the center of the target feature with respect to the center of the originally patterned trench or line.

Further, the box in box and related targets are asymmetric, i.e., the inner box is smaller and the outer box is bigger, and therefore each samples the optical metrology tool pupil differently. Further still, the box in box and related targets do not fully utilize the available scribeline space for metrology purposes. That is, they take up space due to the fact that they need to be spatially separated from one another in order to be correctly acquired by the overlay metrology tool, i.e., if not separated, the metrology tool runs the risk of measuring the wrong target. Moreover, the box in box and related targets are large and cumbersome compared to actual device being printed therewith, and therefore the correctables, which are based on the overlay measurements thereof, may not be the ideal correctables. For example, the correctables may indicate that a correction can be made to get the stepper aligned when ideally it would have been better to rework the wafer. Furthermore, because the overlay measurements are only performed at a few points on the wafer, the correctables may not facilitate optimal process control since they don't represent points across the field.

Other steps such as stepper matching have been utilized recently to reduce the impact of aberrations on wafer processing. Stepper matching generally refers to the process of determining which steppers work well together, i.e., matching steppers such that when two layers are printed on different steppers there is a minimum overlay error between the two layers. As should be appreciated, every stepper has its own unique signature of aberrations or other errors and therefore each stepper tends to print patterns differently for a given set of process conditions. The steppers that print patterns in a similar manner are matched thus minimizing the impact of these aberrations and other errors over the entire process. In most cases, stepper matching is performed by providing a golden wafer having a standard pattern; printing patterns on the golden wafer with each stepper using the same reticle and processing conditions; and calculating the relative difference between each of the steppers by comparing the alignment between the standard pattern and each of the stepper patterns. If the alignment between steppers is similar, then the steppers tend to work well together. If the alignment between steppers is different, then the steppers may not work well together.

Although stepper matching provides some benefit, it is not ideal since it does not provide control feedback during wafer processing, i.e., it does not overcome the problems associated with conventional overlay targets and the manner in which the overlay error is determined therefrom.

In view of the foregoing, a method is desired which is able to isolate, quantify and/or minimize the impact of aberration effects and other process effects on overlay metrology. Furthermore, a method is desired that can utilize the overlay information in a scenario specific way to provide the most accurate possible feedback to the lithography cell for either lithography tool overlay control (e.g., correctables) or product lot dispositioning (e.g., rework).

SUMMARY OF THE INVENTION

The invention relates, in one embodiment to an overlay method for determining the overlay error of a device structure formed during semiconductor processing. The overlay method includes producing calibration data that contains overlay information relating the overlay error of a first target at a first location to the overlay error of a second target at a second location for a given set of process conditions. The overlay method also includes producing production data that contains overlay information associated with a production target formed with the device structure. The overlay method further includes correcting the overlay error of the production target based on the calibration data.

The invention relates, in another embodiment to an overlay processing method. The method includes providing a process robust target. The method also includes forming a device structure along with one or more of the process robust targets on a substrate. The method further includes measuring the overlay error of the one or more process robust targets. The method additionally includes receiving calibration data associated with the one or more process robust targets. Moreover, the method includes predicting the overlay error of the device structure at its position in the field based on the measured overlay error and the calibration data.

The invention relates, in another embodiment to a calibration method. The calibration method includes providing one or more characterization reticles having a plurality of overlay target patterns. The method also includes transferring the overlay target patterns onto a calibration wafer. The method further includes measuring the overlay error of the overlay targets on the calibration wafer. The method additionally includes calibrating the overlay error of the measured overlay targets against one another.

The invention relates, in another embodiment to a method of performing overlay correction analysis. The method includes providing calibration data. The method also includes determining the overlay error of a process robust target located in the scribeline. The method further includes determining the overlay error of a virtual device representing target located in the scribeline based on the overlay error of the process robust target and the calibration data. The method additionally includes determining the overlay error of a second virtual device representing target located at a point in the field based on the overlay error of the first virtual device representing target and the calibration data.

The invention relates, in another embodiment to a method of determining the overlay error of a device structure located within a die. The method includes measuring a process robust target located in the scribeline around the die. The method also includes converting the measured process robust target into a virtual device representing target located in the scribeline. The method further includes converting the virtual device representing target into a second virtual device representing target located within the die. The method additionally includes calculating the overlay error of the second virtual device representing target.

The invention relates, in another embodiment to a method of monitoring overlay. The method includes a calibration mode configured to produce overlay calibration data. The calibration mode includes: forming one or more test dies on one or more test wafers, the test dies containing a plurality of calibration targets; and measuring the calibration targets. The method also includes a production mode. The production mode includes: forming one or more production dies on a production wafer, the production dies containing one or more device structures and one or more production targets; measuring the production targets; and comparing the production measurements with the calibration measurements in order to determine the overlay error of a particular device structure at a particular device location.

BRIEF DESCRIPTION OF THE DRAWINGS

The present invention is illustrated by way of example, and not by way of limitation.

DETAILED DESCRIPTION OF THE INVENTION

The invention generally pertains to a method of carrying out overlay metrology and control as a "use case". One aspect of the invention relates to a method of making a process tolerant metrology mark and calibrating it off-line to the device structures. Another aspect of the invention relates to a method of separating out the offset due to the combination of lens and device geometry from the offset induced by the process. Another aspect of the invention relates to a calibration method of putting the device-like and process robust or tolerant marks on the same wafer so that the offset between them can be characterized. Another aspect of the invention relates to a production method for using the process robust or tolerant mark and compensating for a process-device shift measured in the calibration phase. Another aspect of the invention relates to a method of predicting the true device overlay at any point in the die, for any type of structure by knowing the process tolerant to device (e.g., offsets as a function of location) or by using simulation to understand the root cause of the offset. Another aspect of the invention relates to a method of using simulation to create across field maps, which can be used to take a limited number of measured points and calculate the actual, in-device overlay for any point in the lens field. Another aspect of the invention relates to a method of mapping out aberration induced differences across the entire lens field, and running it on calibration wafers. Another aspect of the invention relates to using gratings or any other type of target in any of the above methods. These and other aspects will be described in greater detail below.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order not to unnecessarily obscure the present invention.

Figure 1:
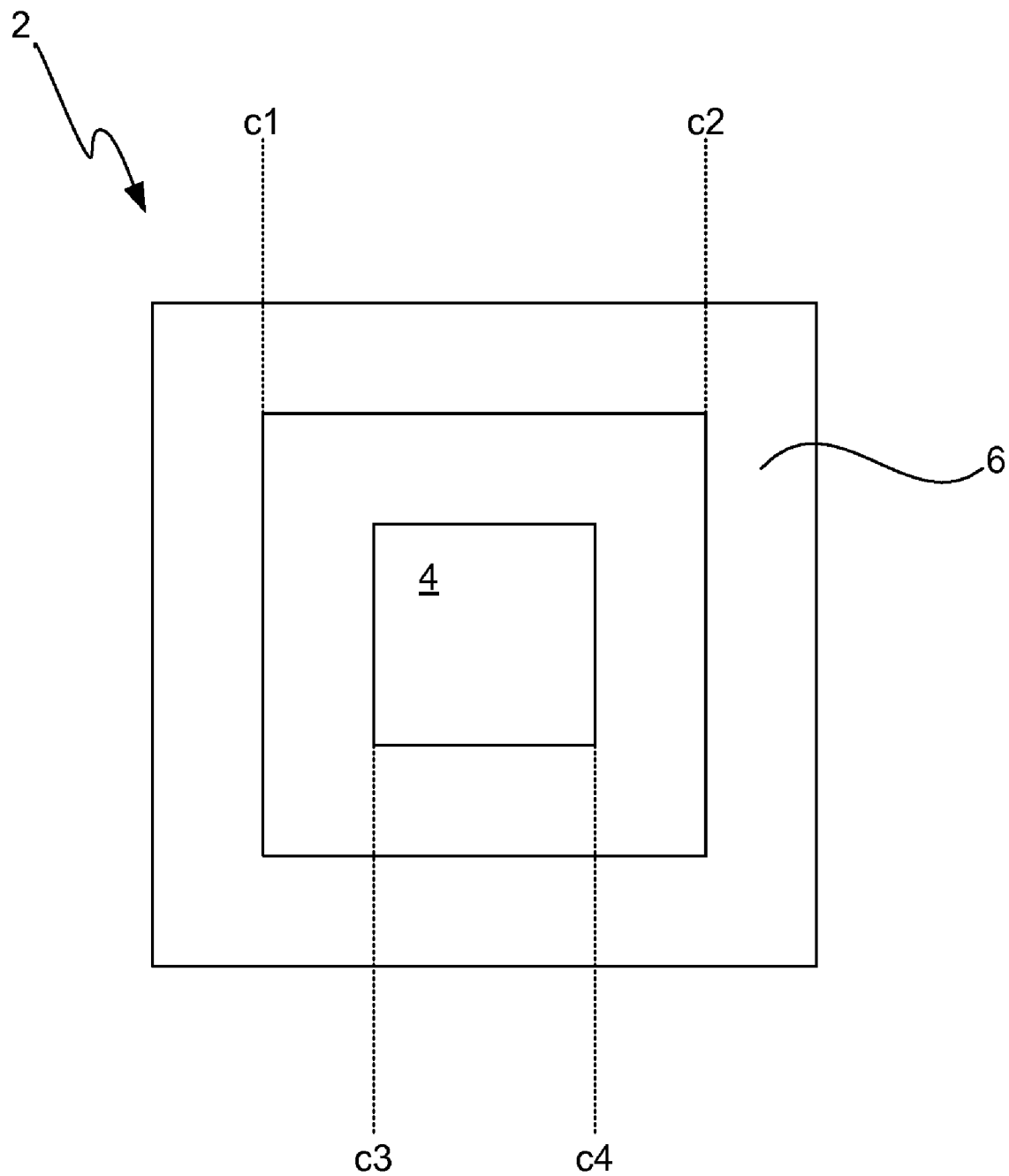
FIG. 1 is a top plan view of an overlay mark, which is well known in the art.
Figure 2:
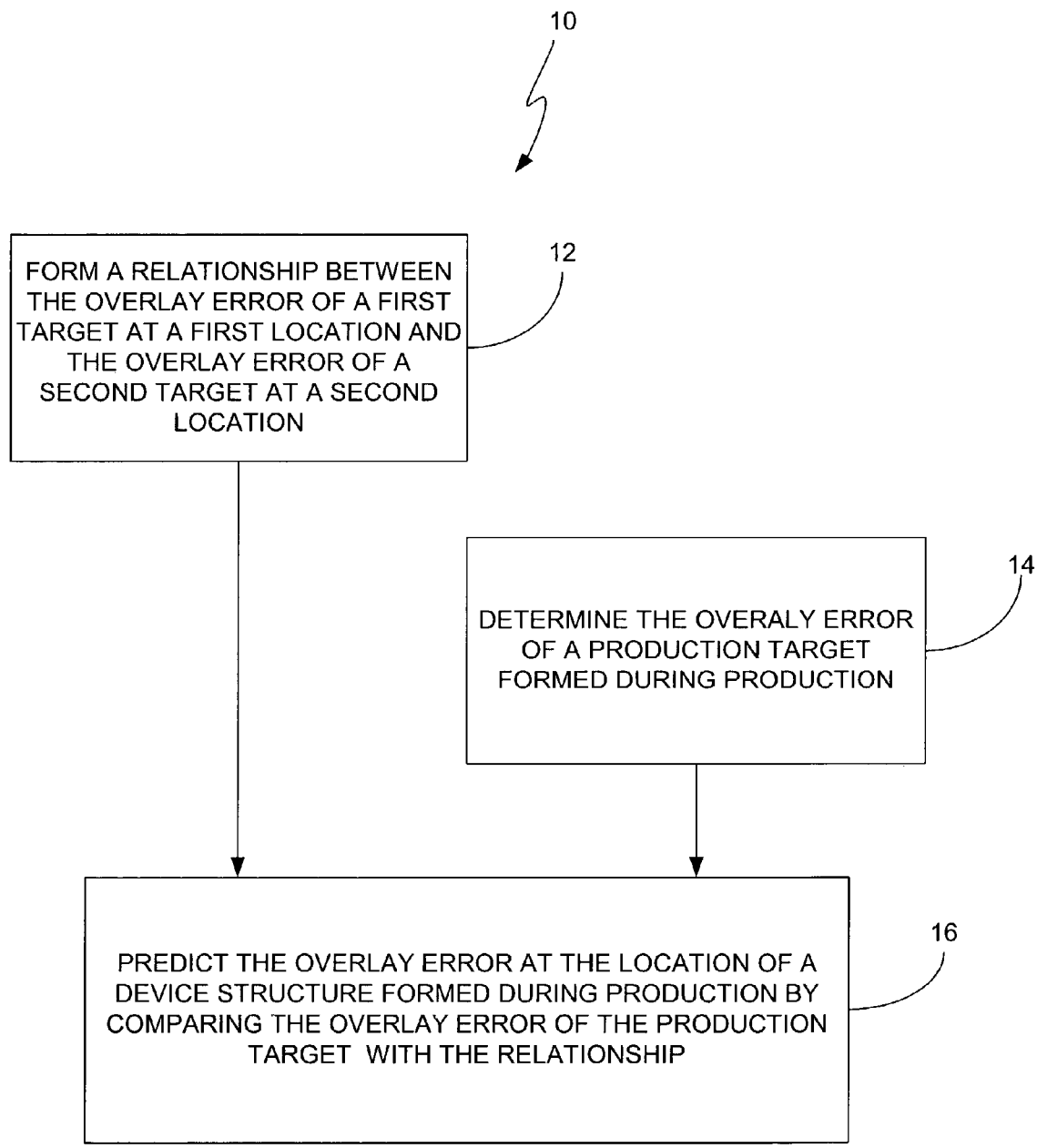
FIG. 2 is a diagram of an overlay method, in accordance with one embodiment of the present invention.

FIG. 2 is a diagram of an overlay method 10, in accordance with one embodiment of the present invention. Overlay method 10 is generally configured to determine the overlay error of a device structure formed during a lithographic process (e.g., photolithographic). The determined overlay error may be used to improve the control of subsequent lithographic patterning and to determine whether the quality of the lithographic pattern meets specified requirements. The method may be suitable for a wide variety of photolithography processes, as for example, photolithographic processes pertaining to semiconductor manufacturing, optical device manufacturing, micro-mechanical device manufacturing, magnetic recording data storage manufacturing and the like. Although the method may be used in any of the above processes, the illustrated embodiment described herein is directed at semiconductor manufacturing. As such, in this embodiment, the device structures may correspond to vias, trenches, lines, and the like.

In brief, overlay error generally pertains to the determination of how accurately a first patterned layer aligns with respect to a second patterned layer disposed above or below it and to the determination of how accurately a first pattern aligns with respect to a second pattern disposed on the same layer. The overlay error is typically determined with an overlay target having structures formed on one or more layers of a workpiece (e.g., semiconductor wafer). The structures may be periodic or they may be based on the structures of the Box in Box and related targets. If the two layers or patterns are properly formed, then the structure on one layer or pattern tends to be aligned relative to the structure on the other layer or pattern. If the two layers or patterns are not properly formed, then the structure on one layer or pattern tends to be offset or misaligned relative to the structure on the other layer or pattern.

Referring to FIG. 2, the method generally consists of a calibration block 12, a production block 14 and a correction block 16. The calibration block 12 is generally implemented before the production block 14 (e.g., preprocessing) while the correction block 16 is generally implemented after the production block 14 (e.g., post processing).

The calibration block 12 is configured to produce calibration data that contains overlay information relating the overlay error of a first target at a first location to the overlay error of a second target at a second location for a given set of process conditions. By calibration, it is generally meant that a relationship is made between the targets, i.e., the overlay errors are calibrated against each other. For example, the calibrated overlay information may include information showing the relative difference between the overlay error of the first target and the overlay error of the second target, i.e., the differences may be found and thereafter characterized relative to one another. The differences may be caused by a variety of factors including, but not limited to, aberrations in the lenses of the lithography system, distortions in the lenses of the lithography system, mechanical errors of the lithography system, errors on the reticle, and the like. The first and second locations may be widely varied. For example, the targets may be positioned almost anywhere inside and outside the field. In most cases, however, the first location corresponds to a typical target location (e.g., in the scribe line) and the second location corresponds to a typical location of a device structure (e.g., field). The overlay information is generally stored in a library for future use, either directly as overlay data or parameterized as mathematical coefficients.

The production block 14 is configured to produce production data that contains overlay information associated with a target formed during production. The location and configuration of the target may be similar to the first target used in the calibration block 12. The target is formed with a device structure using a similar set of process conditions as above. The device structure is typically located proximate the location of the second target used in the calibration block 12. As should be appreciated, in production, the overlay error of the device structure cannot be easily determined and thus the target is used to predict the overlay error of the device structure. Unfortunately, however, as previously mentioned, there may be factors that effect the formation of the device structure and target in a different manner, and thus they may have a different overlay error. For example, since they are not located in the same area, distortions, i.e., aberrations, may affect the device structure and target differently. Another example is that spurious processes adversely affect the device differently than the target, even if they are in close proximity.

The correction block 16 is configured to correct the overlay error of the production target to better reflect the true overlay error of the device structure at its location in the field, i.e., take into account the impact of the various factors. Conventionally, the overlay error is determined at various points, but not at the field position of the device structure, i.e., it was assumed that the overlay error was the same across the sample. The correction is generally implemented by comparing the production data with the calibration data. The comparison generally yields what the overlay error of a second target would have been if formed in the vicinity of the device structure during production (without having to measure it). That is, since the differences between the two calibration targets is known (one of which is located at a point corresponding to the location of the production target, and one of which is located at a point corresponding to the location of the device structure), it may be used, along with the known overlay error of the production target, to solve for the unknown overlay error of a second target that would have been formed in production at the location of the device structure, i.e., the known variables may be used to solve for the unknown variable. In particular, the overlay error of the production target may be converted or translated into the overlay error at the field location of the device structure formed in production by adding or subtracting the differences (either directly or by transformation) found between the overlay error of the first and second target formed in calibration from the production target's overlay error. As should be appreciated, the process can be controlled to a greater degree by knowing the overlay error at the field position of the device structure rather than somewhere else (e.g., scribeline).

In order to further enhance the predicted overlay error of the device structure, any one of the targets may correspond to process robust targets and/or device representing targets. Process robust targets generally refer to targets that can withstand a wide range of process conditions so that they can be measured with optimal performance under production conditions, i.e., the process has little effect on the process robust target measurement results. In essence, the process robust target is the target that gives the most consistent metrology results across the widest range of process conditions (e.g., CMP, Sputter, film thickness, exposure). Device representing targets, on the other hand, generally refer to targets that produce an overlay error similar to an actual device formed on a product wafer for a given set of process conditions. That is, device representing targets typically change in a similar manner as the device structure itself across the widest range of parameters (lens aberrations, focus, exposure, etc.). For example, if the device structure shifts 10 nm to the right then so does the device representing target.

Different variations of the process robust and device representing targets may be used. For example, in the calibration block, process robust targets may be calibrated against process robust targets, process robust targets may be calibrated against device representing targets, and/or device representing targets may be calibrated against device representing targets between one and/or several layers. In one particular embodiment, the calibration is between process robust and device representing targets. In particular, the first target corresponds to a process robust target and the second target corresponds to a device representing target. Because the production target is typically configured similarly to the first calibration target, then it too generally corresponds to a process robust target. This is generally done to provide a better overlay determination. That is, since the process robust target is insensitive to unwanted variation, it tends to provide the most accurate and consistent overlay information in production, i.e., its not distorted by the process in unwanted ways. Furthermore, since the device representing target is more device representing, it tends to provide the most accurate overlay information with regards to how the process affects the actual device structure.

In one embodiment of the invention, the first target corresponds to a process robust target, i.e., configured to withstand a wide range of process conditions so that it can be measured with optimal performance under production conditions, and the second target corresponds a device representing target, i.e., configured to produce an overlay error similar to an actual device formed on a product wafer for a given set of process conditions. As should be appreciated, the device itself cannot be easily measured and thus a device representing target is used to mimic what is happening with the device at the location of the device in the field. By way of example, the device representing target may have spatial characteristics that are similar to the actual device (size, pitch, etc.), and may be located proximate the location of the actual device when formed on a product wafer.

The most process robust target is generally determined in a previous step. In one implementation, the most process robust target is determined by forming a plurality of process robust targets (e.g., tens to hundreds) across one or more wafers with various process conditions and with various known offsets to the overlay, and then measuring the process robust targets to see which targets are closest to a known overlay value. The targets closest to the known overlay value over the widest range of process conditions are considered the most process robust. The goal is generally to find a single process robust target for a given process, i.e., wafer layer, process conditions, tool, and the like.

The most device representing target is also generally determined in a previous step. In one implementation, the most device representing target is determined by printing a plurality of device representing targets across one or more wafers with various parameters; measuring the device representing targets; and comparing the measurements to the device itself over a wide range of conditions to see which device representing targets are closest to the ideal device structure, i.e., which device representing target stays faithful to the way that the device varies with parameters. The comparison may be widely varied. In most cases, the comparison is made using computational simulation (where physical process are modeled via sophisticated computer programs well known in the industry). Alternatively, scanning electron microscope (SEM), CD-SEM, Cross sectional SEM, atomic force microscope (AFM), high resolution profiler (HRP) techniques may be used to compare the two structures. The goal is generally to find a single device representing target for a given process, i.e., wafer layer, process conditions, tool, and the like.

The manner in which the calibrated data is produced may be widely varied. For example, it may be produced using simulation and/or experimental methods. In the illustrated embodiment, the calibrated data is obtained experimentally by forming two or more targets at various locations on a test wafer for a given set of process conditions using conventional wafer processing techniques; measuring the overlay error of the targets using conventional overlay metrology tools; and then correlating the overlay error between different targets at different locations for the given set of process conditions. With regards to forming the targets, the targets are generally patterned on a test wafer using suitable photolithographic techniques. In the simplest case, the targets are formed within a photoresist layer on the test wafer (e.g., resist/resist wafer). Alternatively, the targets may be formed in other layers such as dielectric or metal layers. With regards to measuring the targets, the overlay measurements may be performed using a variety of methods and metrology tools. For example, they may be performed using imaging, scanning, scatterometry and the like. Furthermore, with regards to correlating, the targets may be configured to have zero nominal overlay therebetween, i.e., zero overlay between the target structures. As such, any overlay error that occurs between any two targets during processing is an indication that the process is inducing a relative shift at one area of the wafer relative to another area of the wafer.

The position, number and configuration of the targets may be widely varied. For example, the targets may be positioned almost anywhere on the test wafer. In one particular embodiment, at least one target is positioned at a future measurable position on the wafer, and at least one other target is positioned at a future site of a device structure on the wafer. As such, the calibrated data includes overlay information associated with different areas of the wafer with one corresponding to the field position of the device structure. Accordingly, the calibrated data may be used in later steps to help determine the overlay error of a device structure at the location of the device structure in the field.

Further, the targets may be configured with similar attributes or they may be configured with substantially different attributes. For example, the targets may be from the same target family (substantially similar attributes) or they may be from a different target family (substantially different attributes). Even targets from the same target family may be configured differently, i.e., although they show similar attributes overall, they have some attribute that differentiates it from its family member. By way of example, a first target family may contain process robust targets and a second target family may contain device representing targets.

Further still, any number of targets, with any configuration, may be used so long as there are at least two. For example, a target from a first target family may be correlated with another target from the first target family or with a target from a second target family, a target from a first target family may be correlated with a plurality of targets from a second target family, a target from a second target family may be correlated with a plurality of targets from a first target family, a plurality of targets from a first target family may be correlated with a plurality of targets from a second target family, and so on. Moreover, it should be noted that two target families are not a limitation, and that more than two target families may be used. In most cases, a group of targets from different target families are used across the entire exposure field so as to form a cross reference matrix, i.e., there may be targets almost everywhere inside and outside the field (e.g., checkerboard), each of which is characterized to all or a portion of the others (a large set of permutations).

The manner in which production data is produced may also be widely varied. In one particular embodiment, the production data is produced by forming a target and the device structure on a product wafer using conventional wafer processing techniques, and measuring the overlay error of the target using conventional metrology tools. With regards to forming the target and device structure, the target and device structure are generally patterned on a product wafer using suitable photolithographic techniques. In the simplest case, the target and device structure are formed within a photoresist layer on the product wafer. Alternatively, however, the target and device structure may be formed in other layers such as dielectric or metal layers. The target is generally configured similarly to one of the correlated targets. For example, it may have a similar location on the wafer, it may use the same periodic structures, and the like. The production target is generally located within specific areas of the production wafer, i.e., they are typically not located across the field. In most cases, the production target is located in the scribeline of the exposure field. As should be appreciated, the scribe line is the area of the wafer that is cut to form semiconductor dies. The scribe line is generally used since real estate is so valuable on the product wafer within the die. However, it should be noted that this is not a limitation and that any portion of a wafer may be used. For example, the wafer may include production targets within the field proximate the device structure. With regards to measuring the target, the overlay measurements may be performed using a variety of methods and metrology tools. For example, they may be performed using imaging, scanning, scatterometry and the like.

Although the method is described as determining the overlay error at the field location of a device structure, it should be noted that it may also be used to determine the overlay error at any location, especially locations that are not typically used for targets.

Figure 3:
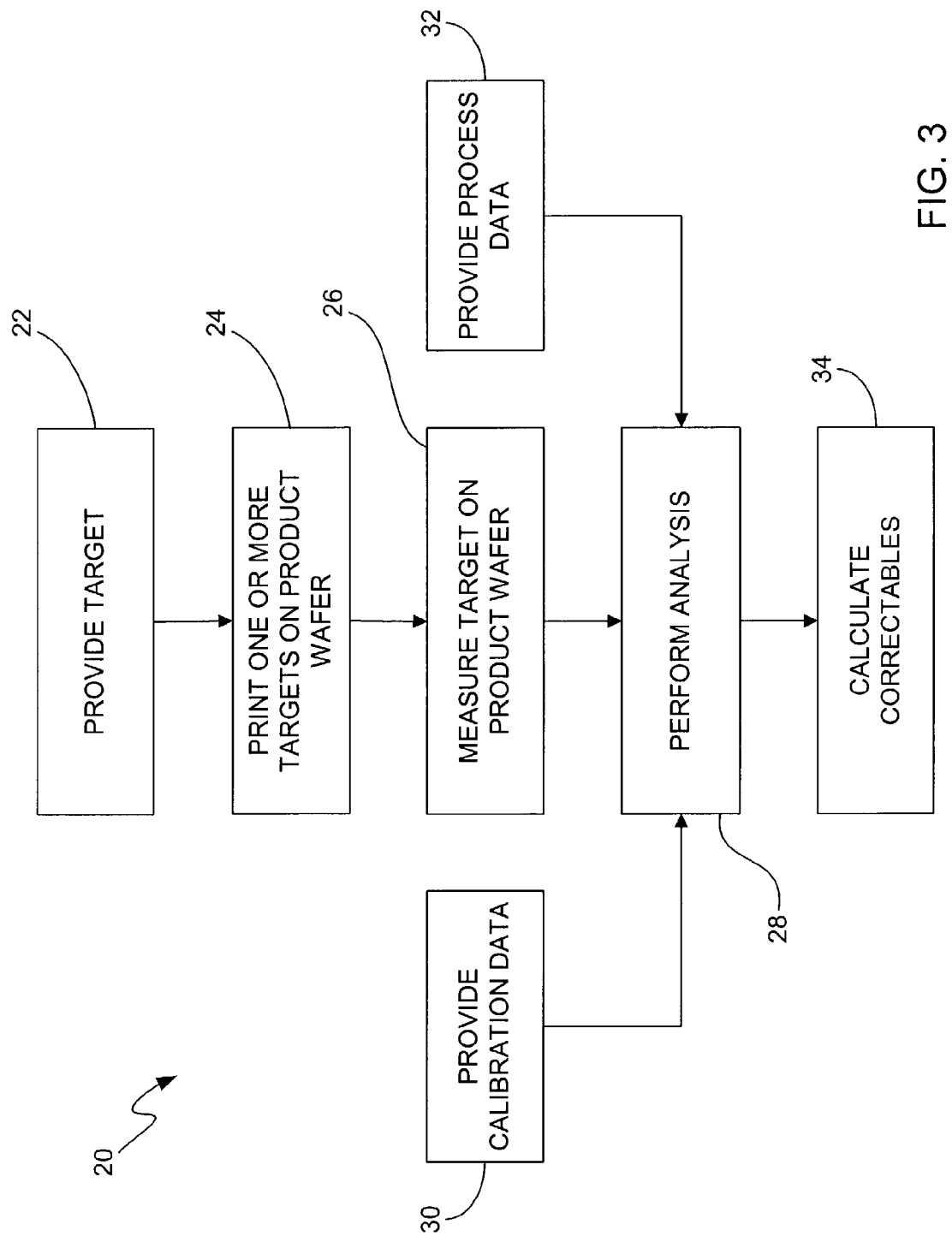
FIG. 3 is a flow diagram of overlay processing, in accordance with one embodiment of the invention.

FIG. 3 is a flow diagram of overlay processing 20, in accordance with one embodiment of the invention. The flow generally begins at block 22 where a process robust target is provided. The process robust target may be a single standard target used across all layers, processing conditions, steppers and the like or it may be a target designed for specific device structures (e.g., vias, lines, etc.), specific spatial characteristics (e.g., period, pitch, resolution, etc.), specific layers (e.g., dark field, light field, etc.), specific processing conditions (e.g., exposure, numerical aperture, coherence, etc.), specific materials (e.g., photoresist), specific steppers (e.g., process bias), specific masks (e.g., binary, phase shift, etc.) and/or the like. The targets based on specifics are generally found in a previous step either experimentally or by simulation. The general concept is to find one target that works best for a given set of device specific data, i.e., the target that is the most process robust. It should be noted, however, that more than one target may be selected in some circumstances. The target (s) (whether standard or specific) may be widely varied. For example, they may correspond to conventional box in box or related targets (e.g., box in bar, bar in bar and the like) or they may correspond to periodic structures such as those found in U.S. patent application Ser. No. 09/894,987 to Ghinovker et al., titled "OVERLAY MARKS, METHODS OF OVERLAY MARK DESIGN AND METHODS OF OVERLAY MEASUREMENTS", filed on Jun. 27, 2001, which is hereby incorporated by reference (or equivalents thereof).

In one embodiment, the specific target is chosen from a group of targets stored in a library. The specific target that best fits the device specific data is typically selected, i.e., this target works best for this data. In another embodiment, the specific target is designed using a set of design rules. For example, for a given set of device specific design rules, the target should have a particular pitch, linewidth, spacing, and the like. The target may be determined using a target design tool configured to walk an engineer through a series of questions about the process and to determine the appropriate target based on design rules and the answers to the questions (e.g., using an algorithm).

Following block 22, the process flow proceeds to block 24 where one or more of the provided targets are printed on a production wafer along with device structures (i.e., structures that form a die) during normal wafer processing. By way of example, the targets may be printed using standard wafer processing techniques that are well known in the art. The targets are generally placed in the scribeline where they are conventionally placed. In one implementation, the targets are positioned at the four corners of the field.

After block 24, the process flow proceeds to block 26 where one or more of the printed targets are measured. This is generally accomplished with an overlay metrology tool. The overlay tool may be widely varied. By way of example, the overlay tool may be based on imaging, scanning, scatterometry and the like. One particular tool that may be used is the Archer 10, which is manufactured by KLA-Tencor of San Jose, Calif. In one implementation, the targets positioned at four corners of the field are measured.

After block 26, the process flow proceeds to block 28 where overlay analysis is performed. The overlay analysis 28 generally includes receiving calibration data (block 30) and the overlay measurements (block 26). By way of example, block 28 may generally correspond to block 16 in FIG. 2. Overlay analysis 28 generally includes making a prediction of the overlay error at any point in the wafer and field, and more particularly the overlay error of a device structure at its position in the field. This is generally accomplished by comparing the overlay measurements of the process robust target to the overlay data contained in the calibration data. In particular, the overlay measurements found at the scribeline are compared with overlay data that is mapped across the field. The calibration data generally includes overlay data relating targets at different points in the field. For example, the calibration data may include a relationship between the overlay located in the scribeline and the overlay located in the field. The relationship may be formed with a variety of targets including both process robust and device representing targets. In most cases, the relationship is between process robust and device representing targets, and more particularly process robust targets located in the scribeline and device representing targets located across the field. The calibration may be in the form of direct offsets at a given locations in the field, by extrapolation at a given points of the field, or based on a mathematical transformation of the overlay at a given points of the field based on a parameterization. The calibration for a particular exposure tool (or exposure tool pair) can also be referred to as a signature.

In one embodiment, the overlay error of a device structure at its field location is predicted by: 1) converting one or more measured process robust targets located in the scribeline to one or more virtual device representing targets in the scribeline using the calibrated data; 2) converting the one or more virtual device representing targets located in the scribeline to one or more virtual device representing targets in the field location of the device structure using the calibrated data; 3) calculating the overlay error of the virtual device representing targets in the field location of the device structure; and 4) averaging the one or more device representing targets in the field location of the device structure (if more than one target is used). By virtual it is generally meant that the device representing target exists in effect though not in actual fact.

By way of example, the first conversion may be performed by translating the measured process robust target at a first layer to a virtual device representing target at the first layer and by translating the measured process robust target at a second layer to a virtual device representing target at the second layer via tables, equations, or transformations that represent the calibration data. With this information, the overlay error of the device representing targets in the scribeline can be determined (the misalignment between the first and second layers). In addition, the second conversion may be performed by translating the virtual device representing target at the first layer to a second virtual device representing target at the first layer and by translating the virtual device representing target at the second layer to a virtual device representing target at the second layer via tables, equations, or transformations that represent the calibration data. With this information, the overlay error of device representing targets in the field can be determined (the misalignment between the first and second layers).

The relationship generally indicates differences found between the overlay error at any two points in the field. For example, the relationship may include the offsets between any two points in the field. With this information, a better prediction of the overlay may be found during production. In general, the process includes calibrating back the difference or offset between the process robust target and the real device at different places across the field. That is, the overlay error of the process robust target in production may be adjusted based on the differences, as for example, the differences between a calibrated process robust target located in the scribeline and a calibrated device representing target located in a region proximate the location of a device structure. For example, the differences in overlay found between the process robust target and device representing target during calibration may be subtracted from the overlay error of the process robust target measured in production in order to remove additional errors that are inherent in the measurement. As should be appreciated, the additional errors are generally due to the fact that the measurement is based on a process robust target in the scribeline, and the desired overlay data is for a device structure located somewhere else other than the scribeline (different structure and a different location). In essence, two corrections have to be made 1) have to correct for the fact that this is a process robust target and not necessarily a device representing structure and 2) have to correct for the fact that the process robust target is in the scribeline and not at other points in the field.

In one embodiment, all the data points in the calibration data are measured up front and loaded into a database directly for future use (previous to a production run) or can be parameterized or mathematically transformed into a set of parameters In one implementation, the calibration data also includes the differences between the data points and thus the analysis block only has to compare the differences with the measured production data. In another implementation, only the raw data is stored and thus the analysis block 28 also includes looking up the raw data and calculating the differences.

In another embodiment, after the aberration effects on the design rules are measured with the device representing structure (DRS) marks and the calibration data is known, the production wafers have process robust structures (PRS) (Layer 1) and (PRS) (Layer 2) marks in the scribeline following the standard overlay sample plan. These marks are measured and their overlay values are used to calculate the correctables using the database and a methodology to allow for minimum overlay in the field for all the devices with their corresponding design rules.

After block 28, the process flow proceeds to block 34 where the optimal correctables are calculated. The term correctables generally refers to data that may be used to correct the alignment of the tool to improve the control of subsequent lithographic patterning with respect to overlay performance. In essence, the correctables allow the wafer process to proceed within desired limits, i.e., provides feedback and feed forward to get the tool better aligned. The calculations are generally performed using the overlay information from block 28 and process data from block 32. The process data 32 generally includes data associated with the production process. By way of example, the process data may include information regarding the printed device structures, the layers in which the device structures are printed, the processing conditions, stepper and masks used to form the device structures, and/or the like. As should be appreciated, the process data helps to form better correctables. The correctables are generally calculated using conventional techniques that are well known in the art. However, it should be noted that although the techniques are conventional the correctables that are calculated herein are less than conventional. In the past, the correctables were simple and limited and failed to incorporate the subtleties of the stepper and the device structure. It didn't matter, if production was done at the via or poly level, the methodology of calculating the correctables would be the same. In contrast, using the above technique, the correctables can be substantially improved utilizing more information.

Although block 34 is described as calculating correctables, it should be noted that block 34 may also be used for lot disposition metrics. The term lot disposition metrics generally refers to data that may be used to determine whether the quality of the lithographic pattern meets specified requirements (e.g., whether the wafers should be reworked or not).

Figure 4:
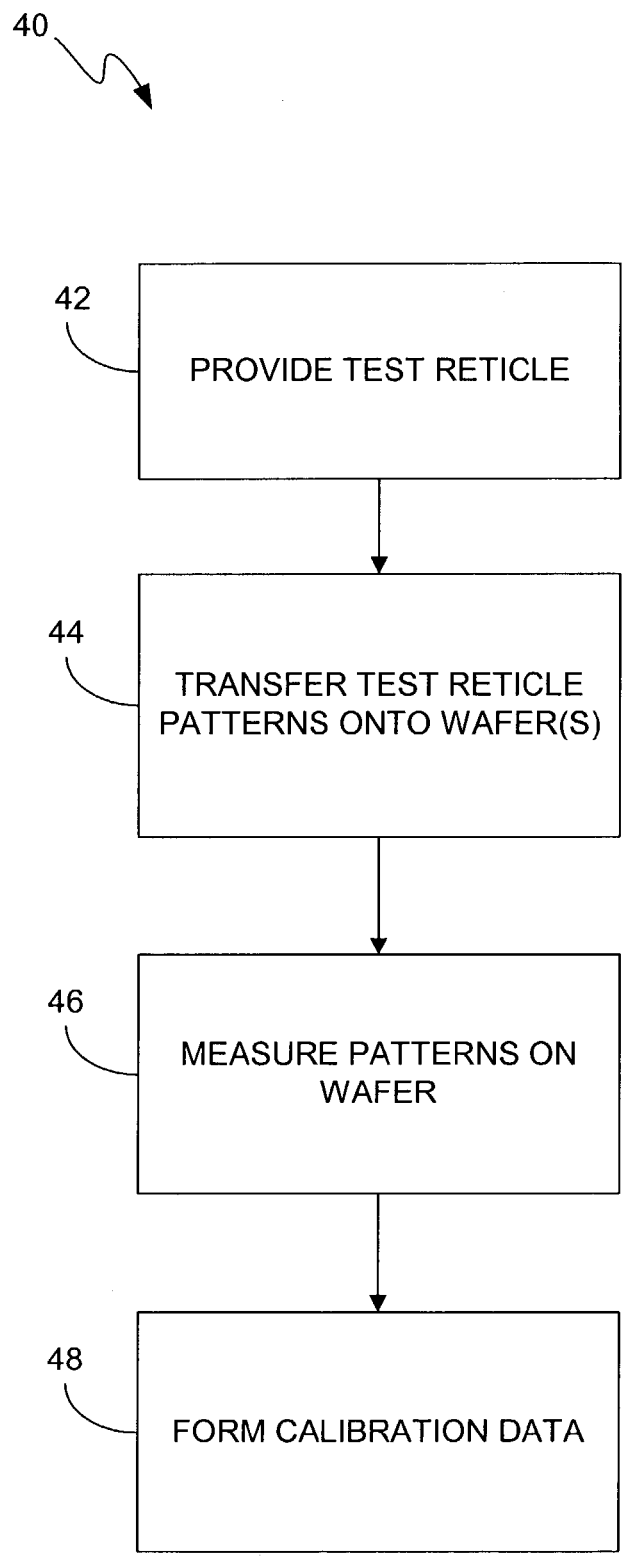
FIG. 4 is a flow diagram of a calibration method, in accordance with one embodiment of the invention.

FIG. 4 is a flow diagram of a calibration method 40, in accordance with one embodiment of the invention. The calibration method is configured to produce calibration data. The calibration data may be used during production to make better predictions of the overlay error. In most cases, the calibration method is performed before a production run. The calibration method may be implemented once or periodically. By way of example, the calibration method 40 may generally correspond to block 30 in FIG. 3. The calibration method 40 generally begins at block 42 where a characterization reticle is provided. The characterization reticle is generally provided by the overlay tool manufacturer, although this is not a requirement. The characterization reticle generally includes a large array of overlay target patterns located across the entire characterization reticle surface. The patterns may be based on process robust and/or device representing designs. In most cases, the characterization reticle includes a combination of process robust and/or device representing designs.

The type of overlay target patterns may be widely varied. For example, they may be conventional box in box or related targets (e.g., box in bar, bar in bar and the like) and/or they may correspond to periodic structures such as those found in U.S. patent application Ser. No. 09/894,987 to Ghinovker et al., titled "OVERLAY MARKS, METHODS OF OVERLAY MARK DESIGN AND METHODS OF OVERLAY MEASUREMENTS", filed on Jun. 27, 2001, which is hereby incorporated by reference (or equivalents thereof).

The method of designing the reticle may be widely varied. In one particular embodiment, the method includes: 1) establishing device representing targets that act most like the device structures; 2) establishing process robust targets that can withstand the process; and 3) distributing the targets across the reticle surface.

The step of selecting the targets generally includes: 1) designing device representing and process robust targets with a range of spatial characteristics (e.g., line width, pitch, duty cycle) and shapes (e.g., box-in-box, lines/spaces arrays, hole arrays, etc.); 2) running the device representing and process robust targets through a process with various permutations of the process (e.g., exposure, focus, etc.); 3) measuring the targets; and 4) determining which device representing targets performed more like the device structure at its location in the field and determining which process robust targets changed the least across the widest range of conditions. The design of the targets may be based on the device structures themselves (e.g., dense lines, isolated lines, vias, contacts, etc.). That is, they may be designed with similar features. The device representing and process robust targets may be run on the same test wafer or they may be run on different test wafers. In most cases, they are run on different wafers. Further, the targets are typically measured using conventional overlay metrology tools. Further still, the most device representing targets are typically determined by comparing the device representing targets with an actual device structure. The device representing targets that stay faithful to the device structure are selected for the reticle, i.e., the targets that change (shift) in a similar manner as the device structure for various permutations of the process. The manner in which the device structures change may be determined using a variety of validation techniques, as for example, SEM, CD-SEM, Cross sectional SEM, AFM, HRP or the like.

The step of distributing the targets may be widely varied. The generally concept is to cover the widest range of possibilities. For example, there may be hundreds to thousand of process robust and device representing targets located across the entire reticle surface.

In one embodiment, the test reticle is very general and would be applicable for a broad range of design rules, exposure conditions, process layers, etc. In another embodiment, the test reticle is configured to cover a particular design rule, i.e., it may create better data if the test reticle is designed for a specific design rule rather than for universal use.

In another embodiment, the calibration marks reticle is composed of specifically designed areas for different lithography processes. During the exposure of the specific layer, the non-relevant reticle areas are bladed (i.e. not exposed). This way the exposure can be stepped over the field with different exposure conditions saving the cost of developing and reducing the measuring of the calibration database.

After block 42, the process flow proceeds to block 44 where the overlay target patterns are transferred onto a calibration wafer. In most cases, the calibration wafer is a resist/resist wafer and thus by transferring, it is generally meant that the characterization reticle is exposed to illumination thus printing the patterns onto the resist/resist wafer. This is generally accomplished many times across the entire wafer surface, thus filling the wafer with a large number of overlay targets. This process may be repeated on a series of calibration wafers using different resist layers, different stepper settings (e.g., illumination, focus, etc.), different steppers and/or the like. For example, a first wafer may be produced with a first stepper setting, a second wafer may be produced with a second stepper setting and so on or a first wafer may be produced with a first stepper, a second wafer may be produced with a second stepper and so on (or a combination of both). The number of calibration wafers may be widely varied. The number generally depends on the type of processing to be performed in production. It should be noted that resist/resist wafers are not a limitation and that the patterns may be transferred to other process layers. However, resist/resist wafers are typically used since they are easy to measure (e.g., they are not adversely impacted by other process layers).

In one embodiment, a series of wafers is produced for various stepper settings By way of example, a series of wafers may be produced for various illumination settings of a single stepper. Steppers generally have complex control over how they illuminate the field, i.e., steppers generally have different illumination set-ups for different types of layers. In each of these set-ups, the stepper may illuminate different portions of a lens thereby changing the impact of aberrations on the field (e.g., if light is going to different parts of a lens or at different angles, then the field is going to feel the effects of different aberrations). It should be noted that illumination settings is not a limitation and that other stepper parameters may be used to produce a different series of wafers. For example, Numerical aperture, focus, etc. In another embodiment, each wafer of the series of wafers represents a different stepper. As should be appreciated, each stepper has its own signature (or calibration) which may or may not be specific to a particular set of processing conditions.

After block 44, the process flow proceeds to block 46 where the overlay error of the targets on the wafer are measured. This is generally accomplished using conventional techniques that are well known in the art. By way of example, the techniques may be based on imaging, scanning, scatterometry and the like. The targets are measured at many locations within the field. For example, the targets are not only measured at the four corners as is conventionally done, but also across the field. In one embodiment, the reticle is built so that all the targets have offsets set at zero. This is generally done so that the measured offset is the actual offset created during processing (e.g., result of the aberrations and/or distortions).

An embodiment of the above technique can be described as follows: Since the aberration field is a slowly varying function, the scanner field is sampled with a series of repeat units. Each repeat unit is composed of dense mark clusters (DMC). The DMC units are a set of one-layer metrology marks sampling a design rule device representing feature versus a process robust feature. Another set of DMC units sample design rule device representing feature versus another design rule device representing features. This emulates the behavior of layer one features versus layer two features on layer one resist. Most of these marks are used for sanity checks during calibration measurements.

After block 46, the process flow proceeds to block 48 where the overlay error of the measured targets are calibrated against each other. By calibration, it is generally meant, the offsets between any two targets are compared to determine known errors therebetween. That is, the relative difference between the offsets of any two targets are found and thereafter characterized relative to one another. This is typically done across the entire exposure field so as to produce a cross reference matrix where each target is calibrated against every other target. In most cases, the process robust targets are calibrated against the device representing targets. For instance, the overlay of one or more process robust targets at the scribeline may be calibrated against a plurality of device representing targets located at different locations within the field, as for example, in the scribeline or in areas of the device structures. In essence, the differences map the relative impact of the stepper characteristics on the process robust marks as compared to the device representing marks across the entire field. That is, these two types of targets are correlated with each other as a function of the stepper characteristics (e.g., stepper, position in field, illumination, etc.). After the differences are determined, the calibration data is stored, as for example in a calibration database, or fit to modeling equations after which the equations and/or the coefficients of the equations are stored, or mathematically transformed to another representation which is stored.

It should be noted that calibrating process robust targets against device representing targets is not a limitation and that device representing targets may be calibrated against other device representing targets and process robust targets may be calibrated against other process robust targets. This is sometimes done to implement self calibration.

Additionally, it may not be conceivable to calibrate every combination of possible targets, and thus an interpolation step may be included in the above calibration method. As should be appreciated, interpolation can predict a virtually infinite number of overlay values using a set of finite overlay values. That is, using a limited number of measured points, the overlay can be predicted at any point in the field, not just at the points measured. Interpolating may be performed using simulation techniques, standard algebraic interpolation procedures, or mathematical transformations.

Figure 5:
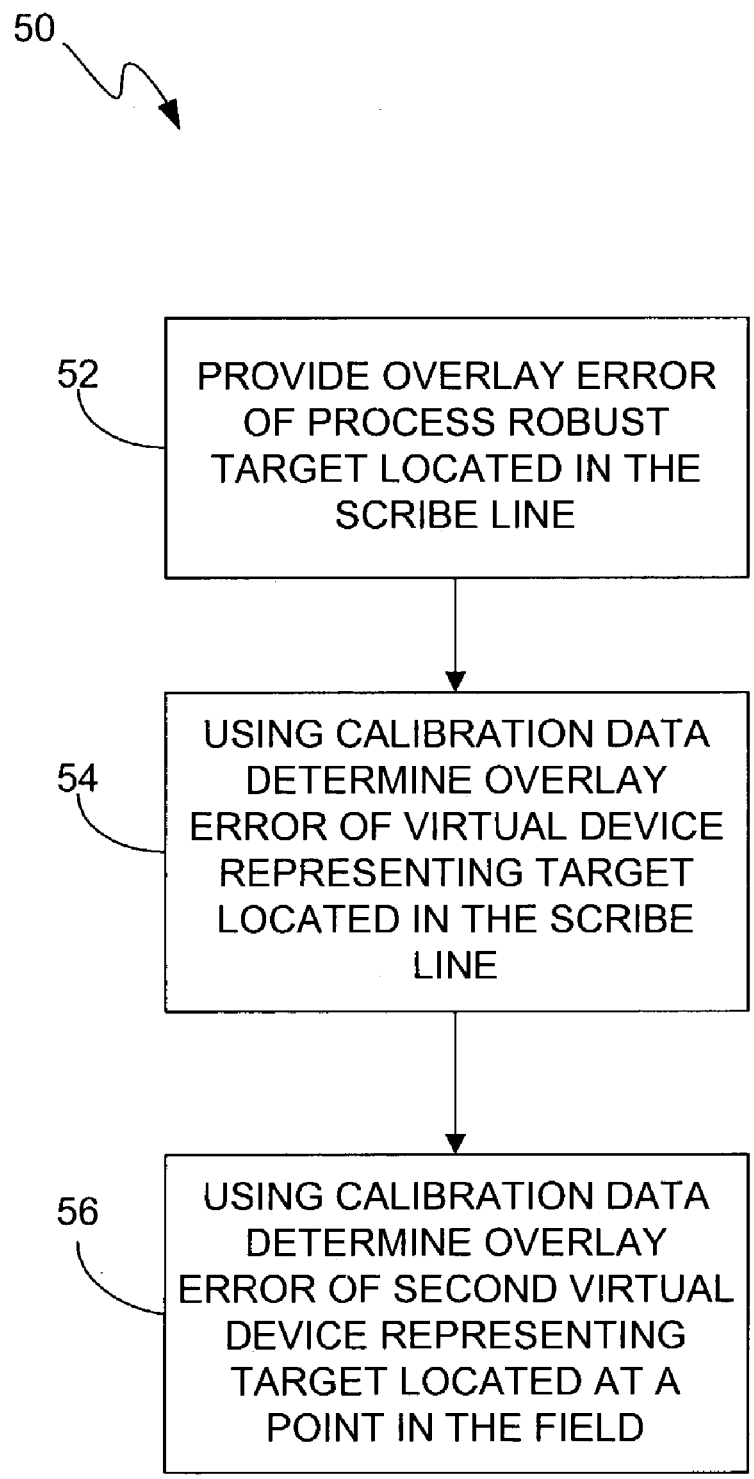
FIG. 5 is a flow diagram of overlay correction analysis, in accordance with one embodiment of the present invention.

FIG. 5 is a flow diagram of overlay correction analysis 50, in accordance with one embodiment of the present invention. By way of example, overlay correction analysis 50 may be implemented in the analysis block 28 of FIG. 3. Overlay correction analysis 50 generally begins at block 52 where the overlay error of a process robust target in the scribe line is provided. This is generally accomplished by measuring a process robust target using conventional overlay measuring techniques. After block 52, the process flow proceeds to block 54 where the overlay error of a virtual device representing target located in the scribe line is determined using calibration data and the measured process robust target. By virtual it is meant that the device representing target exists in effect though not in actual fact. This determination is generally accomplished by matching the measured process robust target with a similar process robust target that was previously calibrated against a device representing target in the scribeline. Thereafter, the calibrated differences between the overlay of the calibrated targets are subtracted or added into the overlay error of the measured process robust target to determine the overlay error of the virtual device representing target that would have been printed in the scribeline. After block 54, the process flow proceeds to block 56 where the overlay error of a second virtual device representing target located at a point in the field is determined using the calibration data. This is generally accomplished similarly to above by matching the virtual device representing target found in block 54 with a similar device representing target in the scribeline that was previously calibrated against a device representing target at a point in the field. Thereafter, the calibrated differences between the overlay of the calibrated targets are subtracted or added into the overlay error of the first virtual device representing target to determine the overlay error of the second virtual device representing target that would have been printed in the field. Although the first and second virtual device representing targets are not the actual device structures, they are configured to act in a similar manner and thus they can be used to better predict what is happening with the device structure at the location of the device structure. As should be appreciated, the above methodology may be used for more than one target, i.e., the overlay error of the device structure at the field may be determined from process robust targets at the four corners of the field. The results of the four corrected errors are then averaged out to form a more accurate overlay value.

Figure 6:
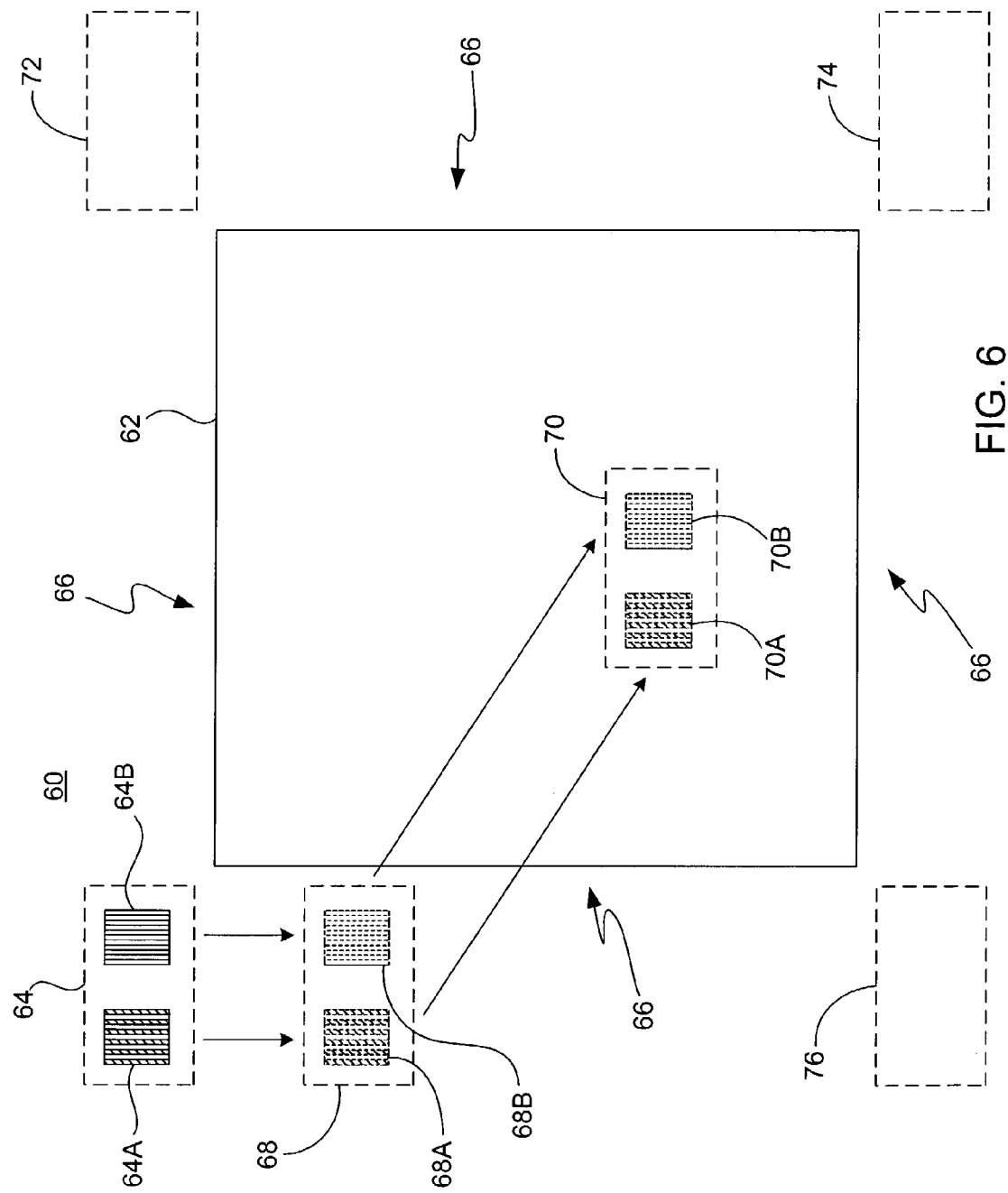
FIG. 6 is an illustration showing one implementation of the method described in FIG. 5, in accordance with one embodiment of the present invention.

FIG. 6 is an illustration showing one implementation of the method described in FIG. 5. The illustration is a close up view of a production wafer 60 having a die 62 being formed thereon. The method generally begins by measuring a process robust target 64 located in the scribeline 66 around the die 62. The process robust target 64 generally consists of a first process robust structure 64A located on a first layer and a second process robust structure 64B located on the second layer of the production wafer 60 (structures located in the first layer are cross hatched and structures located in the second layer are filled in). Thereafter, the measured process robust target 64 located in the scribeline 66 is converted into a virtual device representing target 68 in the scribeline 66. This is typically performed by translating the first process robust structure 64A at the first layer to a first virtual device representing structure 68A at the first layer and by translating the second process robust structure 64B at a second layer to a second virtual device representing structure 68B at the second layer using the calibration data. Thereafter, the virtual device representing target 68 located in the scribeline 66 is converted into a virtual device representing target 70 located within the die 62. This is typically performed by translating the first virtual device representing structure 68A at the first layer to a third virtual device representing structure 70A at the first layer and by translating the second virtual device representing structure 68B at a second layer to a fourth virtual device representing structure 70B at the second layer using the calibration data. In most cases, the calibration data is stored in a conversion table so that the conversions can be accomplished using a simple matching procedure. Thereafter, the overlay error of the virtual device representing target 70 located within the die 62 is calculated, i.e., the offset between structures 70A and 70B. The same process may be performed for process robust targets 72, 74 and 76, which are located in the scribeline at the other corners of the die 62. The overlay error calculated from each corner may be averaged to produce a better prediction of the overlay error. As should be appreciated, the overlay error of the device structure cannot be easily determined and thus it is estimated or predicted with overlay errors that can be determined.

Figure 7:
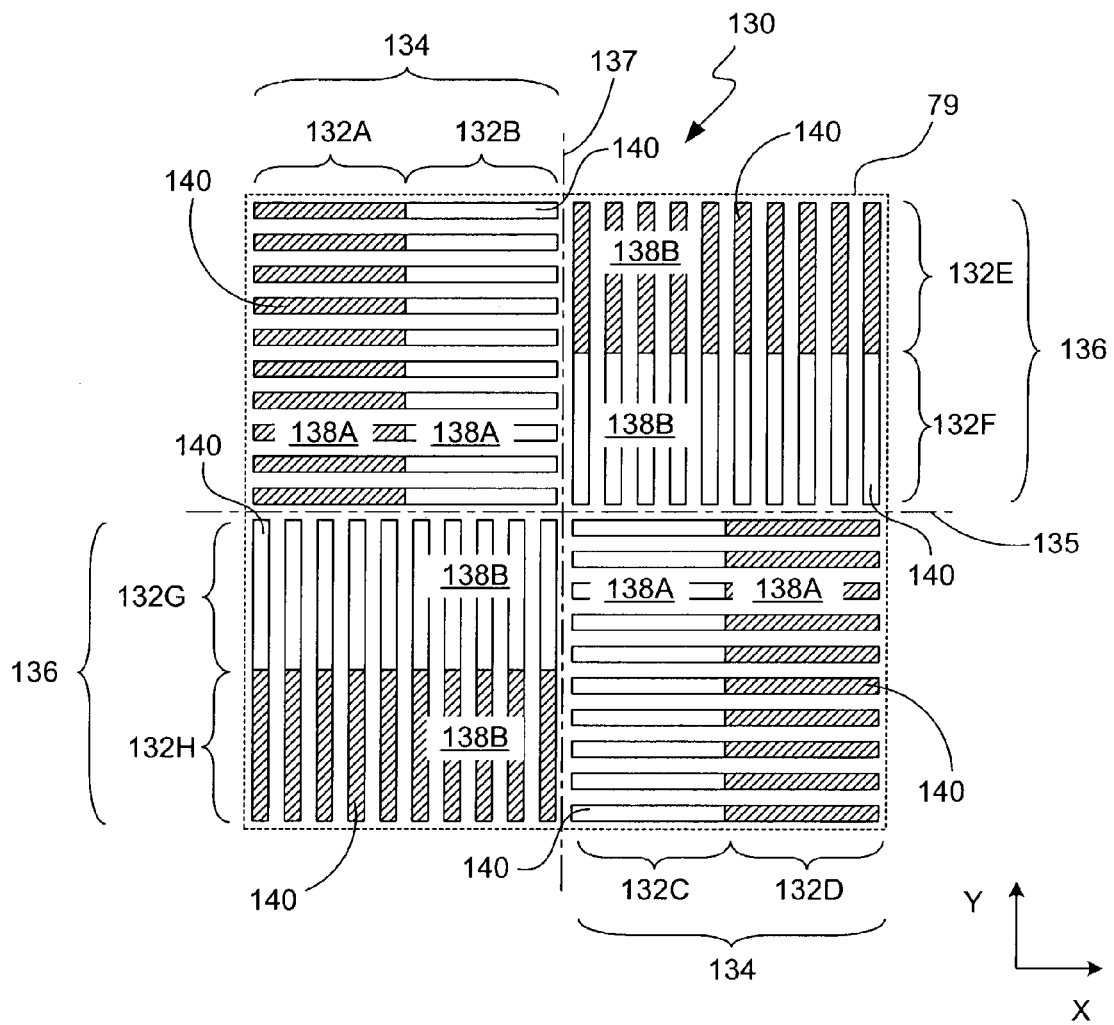
FIG. 7 is a top plan view of a "dual pattern" overlay target, in accordance with one embodiment of the present invention.
Figure 8F:
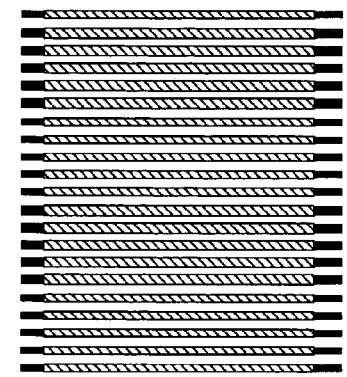
FIGS. 8A-H are examples of device representing metrology marks (line features to line features) for measurement on SEM or AFM, in accordance with one embodiment of the present invention.
Figure 8H:
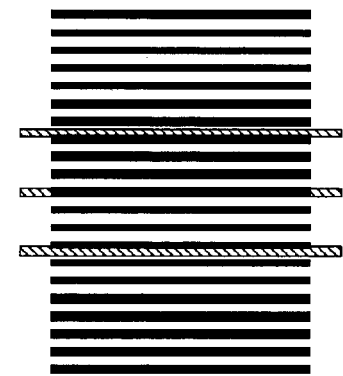
Figure 8E:
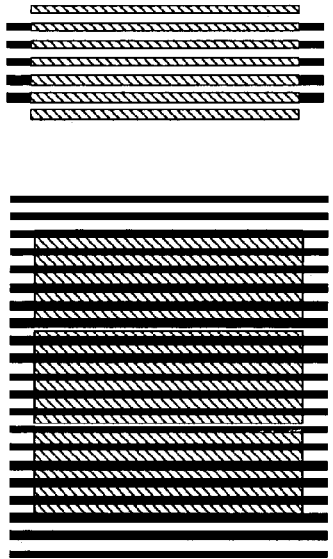
Figure 8G:
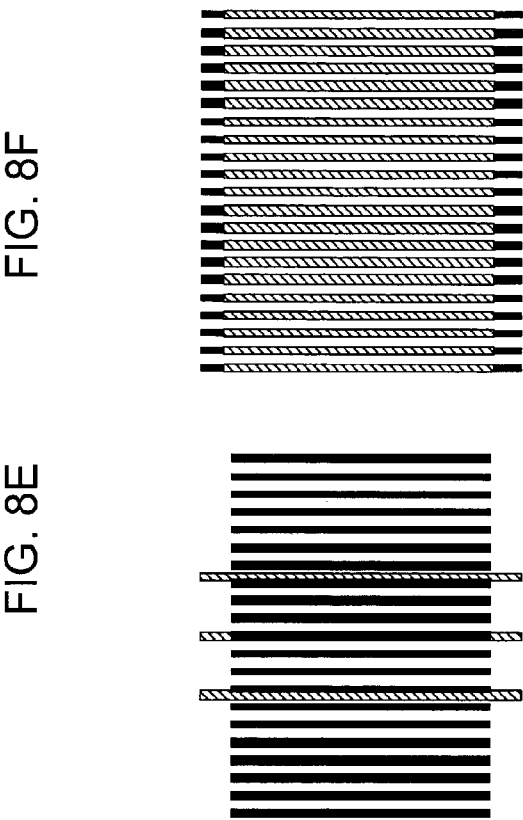
Figure 8B:
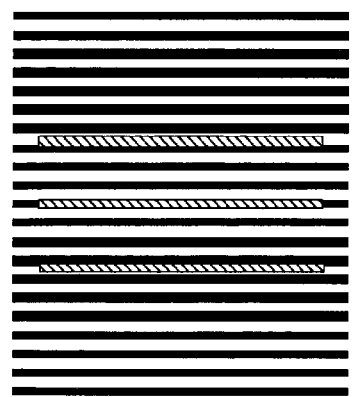
Figure 8D:
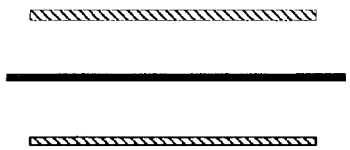
Figure 8A:
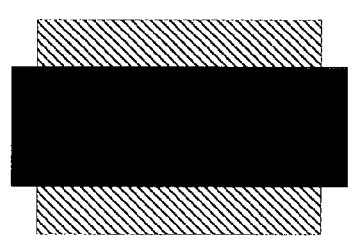
Figure 8C:
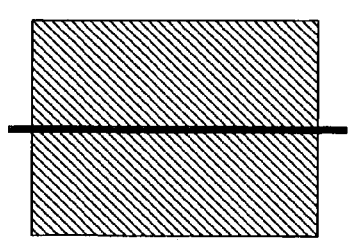
Figure 9A:
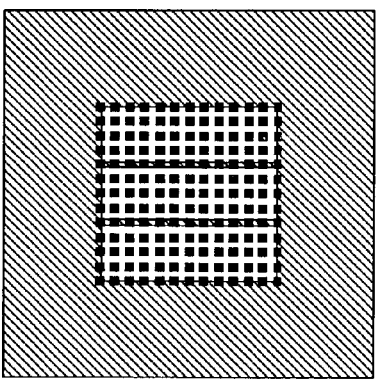
FIGS. 9A-H are examples of device representing metrology marks (line features to hole features) for measurement on SEM or AFM, in accordance with one embodiment of the present invention.
Figure 9B:
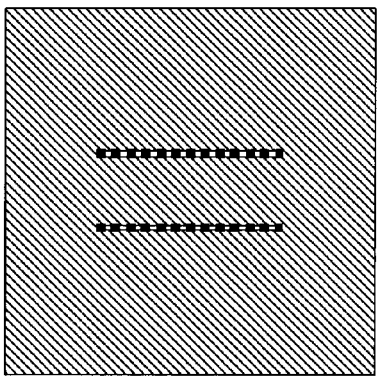
Figure 9E:
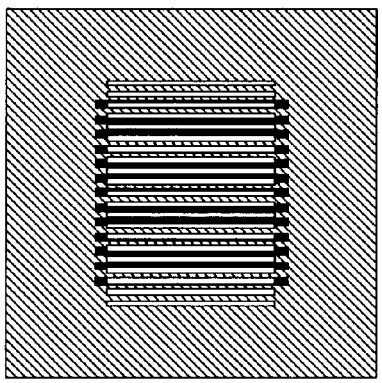
Figure 9F:
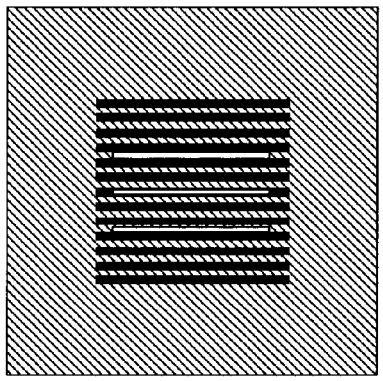
Figure 9C:
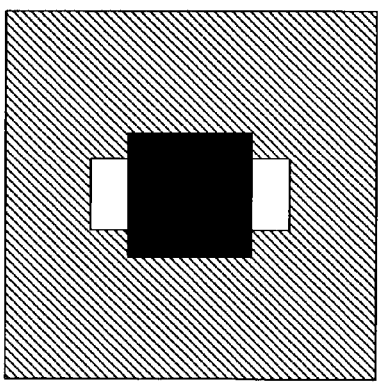
Figure 9D:
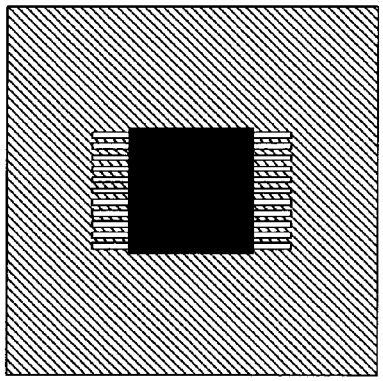
Figure 9G:
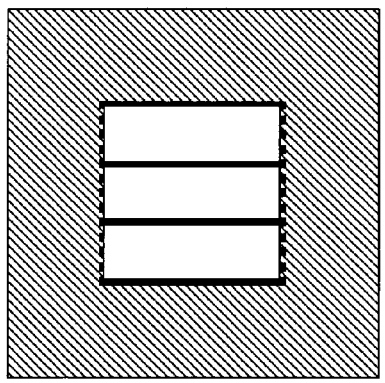
Figure 9H:
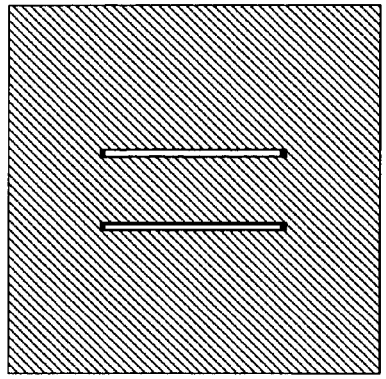
Figure 10A:
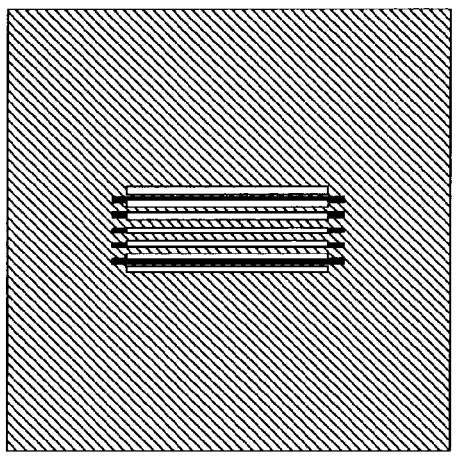
FIGS. 10A-F are further examples of device representing metrology marks (line features to hole features) for measurement on SEM or AFM, in accordance with one embodiment of the present invention.
Figure 10B:
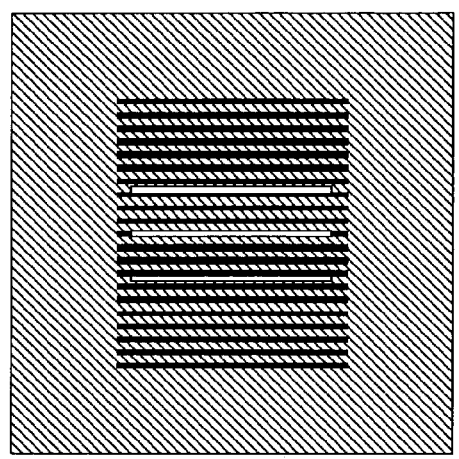
Figure 10C:
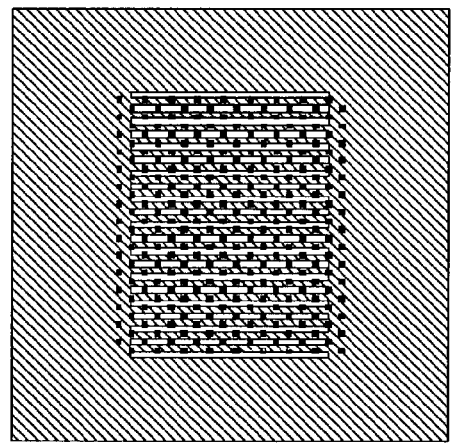
Figure 10D:
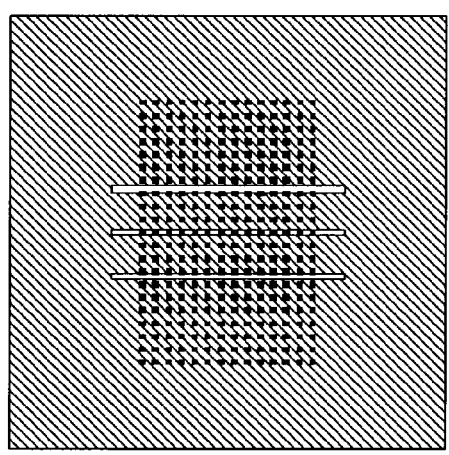
Figure 10E:
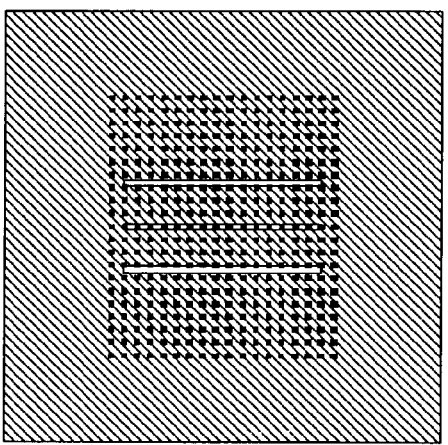
Figure 10F:
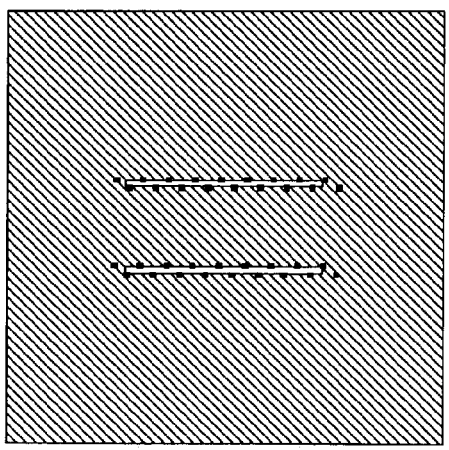

FIG. 7 is a top plan view of a "dual pattern" overlay target 130. By way of example, the target may be found in U.S. patent application Ser. No. 09/894,987 to Ghinovker et al., titled "OVERLAY TARGETS, METHODS OF OVERLAY TARGET DESIGN AND METHODS OF OVERLAY MEASUREMENTS", filed on Jun. 27, 2001, which is hereby incorporated by reference. Overlay target 130 is shown in a configuration that results when the tested layers of a wafer are in perfect alignment. The overlay target 130 is generally provided to determine the relative shift between two or more successive layers of a wafer or between two or more separately generated patterns on a single layer of a wafer. For ease of discussion, the overlay target 130 will be described in context of measuring overlay between different layers of a substrate. It should be noted, however, that the overlay target in this figure may also be used to measure two or more separately generated patterns on a single layer of a substrate.

The overlay target 130 includes a plurality of working zones 132 for determining the registration error between two wafer layers in two different directions. In the illustrated embodiment, the overlay target 130 includes eight rectangularly shaped working zones 132, which are configured to substantially fill its perimeter 71. The working zones 132 represent the actual areas of the target that are used to calculate alignment between different layers of the wafer. As mentioned previously, the working zones 132 are spatially separated from one another so that they do not overlap portions of an adjacent working zone. In this particular configuration, some of the working zones are separated via exclusion zones while other working zones are positioned next to an adjacent working zone. For example, working zone 132B is separated from working zones 132E and F via an exclusion zone 133 while working zones 132E and F are positioned next to one another at their edges.

To facilitate discussion, the working zones 132 are grouped into a first working group 134 and a second working group 136. The first working group 134 includes four working zones 132A-D that are configured to provide overlay information in a first direction. By way of example, the first direction may be the Y direction. Of the four working zones 132A-D, two of them 132A and D are disposed in the first layer and two of them 132B and C are disposed in the second layer (the first layer is represented by cross hatching, the second layer is represented by no cross hatching). As should be appreciated, for this target configuration and in the case of zero overlay error (as shown), the centers of symmetry 135 of working zones 132A&D and working zones 132B&C coincide exactly. The second working group 136 includes four working zones 132E-H configured to provide overlay information in a second direction that is perpendicular to the first direction. By way of example, the second direction may be the X direction. Of the four working zones 132E-H, two of them 132E and H are disposed in the first layer and two of them 132F and G are disposed in the second layer (the first layer is represented by cross hatching, the second layer is represented by no cross hatching). Similarly to the above, for this target configuration and in the case of zero overlay (as shown), the centers of symmetry 137 of working zones 132E&H and working zones 132F&G coincide exactly.

As should be appreciated, each of the groups 134 and 136 represents an "X"-configured target (albeit offset). For example, working group 134 includes working zones 132A&D, which are on the same first layer and in diagonally opposed positions relative to one another, and working zones 132B&C, which are on the same second layer and in diagonally opposed positions relative to one another. Further, working zones 132A&D are angled relative to working zones 1322B&C. Further still, working zone 132A is spatially offset from working zone 132D, and working zone 132B is spatially offset from working zone 132D.

In addition, working group 136 includes working zones 132E&H, which are on the same first layer and in diagonally opposed positions relative to one another, and working zones 132F&G, which are on the same second layer and in diagonally opposed positions relative to one another. Further, working zones 132E&H are angled relative to working zones 1322F&G. Further still, working zone 132E is spatially offset from working zone 132H, and working zone 132F is spatially offset from working zone 132G. In essence, this particular target produces two "X" configured targets that are positioned orthogonal to each other, i.e., working group 194 and working group 196.

To elaborate further, a working zone on one layer is generally juxtaposed relative to a working zone on another layer. For example, in the first working group, working zone 132A is juxtaposed relative to working zone 132B and working zone 132C is juxtaposed relative to working zone 132D. Similarly, in the second working group, working zone 132E is juxtaposed relative to working zone 132H and working zone 132F is juxtaposed relative to working zone 132G. Of the two juxtaposed pairs, the working zone on the second layer is typically positioned closer to the center of the FOV than the working zone on the first layer. For example, working zones 132B and C and working zones 132F and G are positioned closer to the center 142 of the FOV 144 than their juxtaposed working zones 132A and D and working zones 132E and H, respectively. Furthermore, within each of the working groups, the juxtaposed pairs are positioned in an opposed relationship (e.g., diagonal) relative to the other juxtaposed pair in the group. For example, juxtaposed pairs 132A&B are positioned opposite juxtaposed pairs 132C&D, and juxtaposed pairs 132E&F are positioned opposite juxtaposed pairs 132G&H.

As should be appreciated, in this particular target, the configuration of the working zones is rotationally symmetric (±90, 180, 270, 360 degrees around the center of the target). This is typically done to reduce the impact of radial and axial variations across the field of view of the metrology tool, as for example, radial and axial variations caused by non-uniform optical aberrations and illumination that may cause tool induced shifts (TIS). Radial variations generally refer to variations that radiate from the center of the target to the outer regions of the target. Axial variations generally refer to variations that occur in directions along the axis of the target, as for example, in the X direction from the left to the right portions of the target, and in the Y direction from the lower to the upper portions of the target.

Each of the working zones 132A-H includes a periodic structure 138 comprised by a plurality of coarsely segmented lines 140. The linewidths, D, and spacings, s, of the coarsely segmented lines may be widely varied. As shown, each of the periodic structures 138 substantially fills the perimeter of its corresponding working zone 132. As should be appreciated, the periodic structures 138 are also disposed on the layer of its corresponding work zone 132.

For ease of discussion, the periodic structures 138 may be broken up into a first periodic structure 138A that is associated with the first working group 134 and a second periodic structure 138B that is associated with the second working group. As shown, the first periodic structures 138A are all oriented in the same direction, i.e., the coarsely segmented lines 140 are parallel and horizontally positioned relative to each other. The second periodic structures 138B are also all oriented in the same direction (albeit differently than the first periodic structures), i.e., the coarsely segmented lines 140 are parallel and vertically positioned relative to each other. As such, the periodic structures 138A in the first working group 134 are orthogonal to the periodic structures 138B in the second working group 136.

In one embodiment, the coarsely segmented lines of juxtaposed periodic structures are aligned with one another, i.e., if we ignore the different layers they appear to be continuous gratings. For example, the coarsely segmented lines of working zone 132A may align with the coarsely segmented lines of working zone 132B and coarsely segmented lines of working zone 132C may align with the coarsely segmented lines of working zone 132D. In addition, the coarsely segmented lines of working zone 132E may align with the coarsely segmented lines of working zone 132F and coarsely segmented lines of working zone 132G may align with the coarsely segmented lines of working zone 132H.

One advantage of these new overlay structures is that they can be chosen so that two adjacent structures will not have translational symmetry between them, since one can be right handed and the other left handed. As such, they can be placed without any separation between them without risk of incorrect acquisition by the overlay metrology tool resulting in the report of an incorrect metrology result due to measuring the wrong target. This feature allows the maximum possible utilization of available scribeline space for metrology purpose.

A methodology using the overlay target (or equivalents thereof) in accordance with the methods described previously will now be described. A Pattern Placement Error (PPE) characterization reticle is manufactured in which the exposure field is filled with multiple "dual pattern" overlay targets. These dual pattern overlay targets have both the "inner and outer" working zones in the same reticle but with different combinations of periodic structures for the inner and outer working zones. These structure combinations may have, for instance, different pitches varying from as close as possible to the dense array to larger, higher contrast structures designed to survive specific processes to structures very close to the periodicities of the exposure tool alignment targets. These structures are printed in the reticle with zero nominal overlay error between the inner and outer working zones. Any measured overlay is now the result of the differing impact of exposure tool lens aberrations or distortions on the different periodic structures (or aperiodic, isolated, etc. . . . ).

By measuring the overlay resultant from multiple structure combinations from multiple positions across the reticle field a PPE cross-reference matrix can be constructed, which is stored in the analysis database either directly as overlay data, or parameterized, or transformed. This cross reference matrix can be used to map measured overlay from a target to determine the best possible exposure tool correctible for overlay of dense array structures when the overlay target that was used to make the measurement had a periodicity different to that of dense array since it's parameters were optimized for process robustness. Alternatively, the cross reference matrix can be used to select the overlay target with the minimum PPE offset from the device structure while ascertaining the size of the anticipated error. This can be used in overall metrology error budgeting.

Another methodology could be to utilize a lithography modeling tool such as PROLITH from KLA-Tencor in order to interpolate the anticipated PPE for different device structures between those actually included in the PPE reticle. The interpolation can take several forms including simulating targets whose internal dimensions are intermediate to those actually measured or simulating targets whose locations are intermediate to those actually measured, or the like. In this way a finite number of overlay structures can be measured and the results used to generate the PPE corrections for virtually an infinite number of device structures, locations, etc. These outputs can be used to "tune" the stepper correctables or the lot dispositioning output for different structures in the field via analysis software. In this way the periodic (or aperiodic) structure of the overlay target for the underlying layer can in most cases be chosen to be optimized for process robustness on that layer. Since the matrix contains scribe line measurements as well, correlation between later scribe line results to in-chip results can be made.

This methodology will now be described in accordance with one embodiment of the invention. Suppose the PPE characterization reticle contains overlay targets with different types of structures in the inner and outer working zones, covering the bulk of the exposure field each placed with nominally zero overlay between the inner and outer structures. Let us denote by (x, y) the position of a target in the field. Let us also suppose that there are D different structure types for the inner part of the target and P different structure types for the outer part. For clarity, let the inner structures be designed to be device representing structures (DRS), while the outer structures be chosen to be process robust structures (PRS). Generally speaking, these two sets of structures are different. Let us enumerate the set of device representing structures by the index d (d=1, 2, . . . , D), while we shall use index p for the process robust structures (p=1, 2, . . . , P).

Now suppose we wish to measure overlay between two layers L1 and L2. Independently of the PPE correction (i.e., regardless of the absolute accuracy of the targets), the user determines the preferred most process robust structure (out of the outer set) and which is the most device representing structure (out of the inner set) for both layers L1 & L2. Methodologies for making these selections are described below (we shall choose the process robust structures based on criteria of process survivability and resistance to process induced distortion, and the device representing structures as the ones which most closely mimic the aberration dependence of the actual device geometries). Suppose that for layer 1 we select the best device representing structure and assign it the name d1, and the most process robust structure is assigned the name p1. Similarly, for layer 2, we select the most device representing structure d2 and the most process robust target p2.

Next, the PPE reticle is used to manufacture two wafers with multiple resist/resist overlay targets filling the field, one using L1 lithographic exposure conditions and one using L2 conditions. In principle it may be possible to expose different dies on the same wafer with the two different sets of lithographic parameters. We now carry out a set of overlay measurements as follows. All targets on wafer L1 of the chosen type ([d1,p1], i.e. comprising L1 DRS versus L1 PRS) are measured across the field and the vector field $OVL_{d1,p1}(x,y)$ is determined at device and scribeline locations. Similarly, all targets of type [d2,p2] on the L2 wafer are measured and $OVL_{d2,p2}(x,y)$ is determined at device and scribeline locations. These measurements allow the aberration induced PPE variations across the field of L1 and L2 layer optimized targets to be measured. This completes the pre-production or periodic calibration part of the measurement. We now know that if we measure a process tolerant target composed of a first layer target p1 and a second layer target p2, that the device representing target at that location would have given an overlay error $$OVL_{device}(x,y) = OVL_{target}(x,y) - OVL_{d1,p1}(x,y) - OVL_{d2,p2}(x,y).$$

At the product measurement stage, the user measures the real overlay target on the wafer. This overlay target is printed to measure the overlay between the two layers L1 and L2, consisting only of PRS structures, (i.e., of type ([p1,p2]). This overlay target is situated at the position (x',y') typically in the scribeline on the wafer, while the user is interested in measuring overlay for the device features at the point (x,y).

We will now describe how this new technique allows the user to quickly determine the device overlay at any point in the field given the process tolerant measurements in the scribe line, the PRS to DRS calibration data across the field, and the usual stepper matching data.

Suppose the overlay measurements of this real target produced the result $$OVL_{target}(x',y') = OVL_{p1,p2}(x',y').$$

In order to calculate the real device overlay at the device position (x,y) on the basis of the real target measurement at the target location (x',y'), we need to carry out the following transformation:

$$OVL_{device}(x,y) = OVL_{target}(x',y') - C_{dt}(device\text{-}target,x',y') - C_1(x,y,x',y') - C_2(x,y,x',y')$$

Three corrections need to be applied to the measured overlay data measured in the scribeline.

$C_{dt}$(device-target, x',y'), the difference between the device representing target and the process tolerant target measured in the scribeline at coordinates (x',y') is simply the shift we have discussed above:

$$C_{dt}(device\text{-}target,x',y') = OVL_{d1,p1}(x',y') + OVL_{d2,p2}(x',y')$$

This term accounts for the device dependent shift of both the first and second layers of the process robust target in the scribeline.

$C_1(x,y,x',y')$ corrects for the difference in overlay error in the printing of the device representing target in layer 1 in going from the measured coordinates (x',y') to the actual device coordinates (x,y). If there were no lens aberrations, this number would be zero for all targets, and the lens would print an ideal grid. In the presence of real lens aberrations, this value is non-zero. The main contribution to this position dependent shift is a simple translation of all features, characterized by the Zernike coefficients Z1 and Z2 for x and y translation, respectively. Pattern specific offsets are also induced by the higher order Zernike terms.

Similarly, $C_2(x,y,x',y')$ corrects for the difference in overlay error in the printing of the device representing target in layer 2 in going from the measured coordinates (x',y') to the actual device coordinates (x,y).

The correction factors $C_1$ and $C_2$ can be determined in one of several ways.

1) Stepper matching using the Device Representing Structure (DRS). If the steppers are matched to each other (or, equivalently, if each stepper is matched to a reference stepper or set of reference wafers), then the terms $C_1$ and $C_2$ are known explicitly from the matching data. This is a mathematically simple approach, but impractical in production since it would require performing the stepper matching procedure with a wide range of DRS targets to represent different device representing geometries. Fortunately, our calibration scheme can be easily extended to eliminate this requirement for multiple matching databases.

2) Stepper matching using traditional large area matching targets. In this case, the targets are sufficiently large as to be insensitive to most of the higher order aberration terms. Examples of these large matching targets can be included on a PPE calibration reticle for explicit calibration, or one may use data from a PRS of very large size so that it is equally sensitive to lens aberrations as the large stepper matching target. Alternatively, one can use measured stepper lens aberrations (Zernikes) to model the relative aberration sensitivity of the large, stepper matching targets relative to the PRS and DRS targets.

3) Stepper matching using a PRS. This approach eliminates the need for any Zernike correction of assumptions of equivalent aberration sensitivity, and provides the most accurate, easily calibrated results.

Knowing all of the correction terms, we can now write an equation for the device representing overlay at any point (x,y) in the integrated circuit based on the calibration data and the measurement of the PRS target at the scribe line location (x', y'):

$$OVL_{device}(x,y) = OVL_{target}(x',y') - OVL_{d1,p1}(x',y') - $$
$$OVL_{d2,p2}(x',y') - OVL_{d1,m1}(x',y') -$$
$$OVL_{d2,m2}(x',y') + SM1(x,y,x',y') +$$
$$SM2(x,y,x',y') - OVL_{d1,m1}(x,y) -$$
$$OVL_{d2,m2}(x,y)$$

Where $OVL_{d1,m1}(x,y)$ is the difference in measured overlay error for layer 1 at position (x,y) between a device representing structure and the matching structure, $OVL_{d1,m1}(x',y')$ is the difference in measured overlay error for layer 1 at position (x',y') between a device representing structure and the matching structure, and similarly for layer 2. And where SM1 (x,y,x',y') is stepper matching term between stepper 1 and the golden reference and SM2 (x,y,x',y') is is stepper matching term between stepper 2 and the golden reference.

Now some methods for establishing the most process robust structures will be discussed in accordance with several embodiments of the invention. A first approach is to print the series of PRS targets on a test vehicle wafer using the particular process being optimized, as is commonly in practice today. There are several possible criteria by which optimal process robustness could be determined. For example, the structure which shows the minimum tool induced shift variability across multiple fields across the wafer could be selected. An alternate criterion could be the difference between the measurements carried out after resist develop and measurements carried out after etch.

The best device representing structure (DRS) may also be achieved by various methods. In one embodiment, the best DRS is selected by comparing overlay results with CD-SEM or AFM measurements of device representing structures. Such CD-SEM or AFM measurement may also be carried out directly on the overlay metrology features, such as those described in U.S. patent application Ser. No. 09/894,987 to Ghinovker et al., titled "OVERLAY TARGETS, METHODS OF OVERLAY TARGET DESIGN AND METHODS OF OVERLAY MEASUREMENTS". Alternatively, the best DRS could be determined by selecting the structure with the minimum deviation in the Fourier domain between the DRS and the device structure itself. The device structure could be obtained from a standard CAD drawing of the device such as a *.gds (or other standard) file.

One problem that may be encountered using conventional measurement techniques associated with SEM and AFM is to find, in the design of the device, two overlapping structures from the two layers where misregistration is measured. Not only, that such overlap may not exist, but where it does, its field location may vary from device to device, preventing straight forward comparison. It should be noted that in general overlay varies with field position. Another problem is that the two layers of interest may be separated by a layer which is not transparent to the SEM or that does not allow the AFM to probe the underlying structures. In such a case the work around is a SEM cross-section. This procedure is destructive, time consuming and does not always allow for choosing the measurement location. Typical critical alignment schemes limited by this problem are Contact-to-Polysilicon and Via-to-Metal. For more details, please refer to "Comparison of Optical, SEM, and AFM Overlay Measurement", V. C. Jaipraksh and C. J. Gould, SPIE vol. 3677 (1999) p. 229, which is incorporated herein by reference.

In one embodiment, a method is provided to establish a correlation between overlay measured optically in the scribe line and an estimate of overlay at device level using Scanning Electron Microscopy (SEM) and Atomic Force Microscopy (AFM). In order to overcome the aforementioned problems, the method generally includes designing a standardized test cell with device representing structures, which are suitable for SEM and AFM overlay measurements. The cell may contain a single structure or a variety of structures addressing a range of dimensions and densities as present in the device itself. The cell can be placed next to an overlay metrology mark or wherever in the field, as design allows. These type of overlay measurements are typically performed after etch, although this is not a requirement.

In one implementation, the standardized test cell suitable for SEM and AFM overlay measurements is configured with an etched upper layer that does not hide the features of the under layer. By way of example, if the etched layer is exposed through a light field reticle, the design of the overlay structure may consist of bars of the etched layer placed at some nominal distance of a bar or hole of the underlying layer. Deviation from that nominal distance is the overlay. This can be done on two structures to reflect overlay in both x and y directions. FIGS. 8A-H show several cases when the etched upper layer does not hide features of the under layer. In all the Figures, a texture convention is followed. Cross hatching is for the under layer structure (UNLS) and solid lines is for the upper layer structure (UPLS). The examples show a combination of device representing (DR) lines, larger-than-DR lines, isolated and dense lines.

In another implementation, the standardized test cell suitable for SEM and AFM overlay measurements is configured with an etched upper layer that hides features of under layer. By way of example, if the etched layer was exposed through a dark field mask, then most of the layer remains unetched and does not allow the SEM or AFM to relate to the underlying layer. For such layers, the only way to measure overlay is through an etched hole or trench. Since the direction of overlay is not known a priori, both edges of the underlying structure should be visible through the hole. If design rules permit, the overlay structure should have a hole or trench of lateral dimension larger than the width of the underlying structure. FIGS. 9A-H show several cases where the etched upper layer does hides features of the under layer. In the following drawings, the under layer structure (UNLS) can be seen as trenches in white over a crosshatched background or as white lines over a cross hatched background. The first option fits, for instance, the metal layer of a dual-damascene process. The second option fits, for instance, the metal layer of an Aluminum based process. The UPLS is a hole or trench (as in, for instance, the metal layer of a dual-damascene process) in solid on white background.

If the structures described above violate design rule, the overlay structure will have holes or trenches nominally centered on both edges of the underlying line. A shift of location in the orthogonal direction may be needed between left-edge and right-edge structures for layout purpose. FIGS. 10A-10F. Here again x and y overlay are treated separately.

As should be appreciated, overlay is generally defined by two length measurements performed with SEM or AFM. The definition of overlay when the etched upper layer does not hide features of under layer is the offset between the centers of symmetry of the features on the upper versus underlying layer.

Furthermore, the standard structure allows to automate the task of measurement and apply it to a variety of devices for a given process flow. It also allows to map the field and gives the possibility to compare results from different locations, wafers or devices. The design of an integrated circuit includes different linewidths and line densities. This cell gives the flexibility to place the various combinations of design rules and densities. The structures created to solve the transparency problem cannot be found in a design layout. They are specially introduced for the purpose of measuring overlay. The measurement cell can be placed anywhere in the field and is not a function of a specific device design.

A test reticle, where the field is mapped with both optical overlay marks and special overlay marks for SEM or AFM, should be designed with the variety of design rules and feature density as in the process in development. Running this reticle at the various process conditions defining the process windows establishes a base line comparison between optical overlay, that may be measured at the high-volume production stage on one hand, and intrafield variation of overlay for the relevant types of device representing features on the other hand. This baseline may be incorporated into the lot disposition criteria for optical overlay results.

At the high-volume production stage, a small set of special overlay marks for SEM or AFM should be placed in the scribeline, next to optical overlay marks. The correlation between the two types of marks should be periodically measured. The correlation to the baseline defined at the process development stage tends to hold as long as this scribeline monitor stays stable with respect to the defined process window.

An additional challenge faced when trying to achieve the best device representative structure is the trade-off between minimum contrast requirements for the target as measured on the overlay tool and exact replication of the device PPE. The inclusion of even small changes to the periodic structure from that of the device, in order to be able to resolve edges using the metrology tool, induces some residual PPE deviations from the device itself. A number of strategies can be used to minimize this. One enhancement to the above technique in order to address this issue can be achieved as follows. The device representing structure is patterned in resist on a test wafer in a dual reticle sequential exposure. In the first reticle the selected device structure in the layer is accurately replicated in one working zone of the overlay target. In the second reticle, a coarse periodic structure is overlayed on top of this device replicating structure. The two reticles are sequentially exposed and developed, hence avoiding the proximity effects generally associated with the coarse periodic structure which shift the resolved edges in the overlay target in a way unrepresentative of the device.

An alternative solution to this problem which does not require a dual reticle exposure is to reduce the width of the coarse modulation structure of the device representing structure. At sufficiently small line or trench widths, the PPE perturbation is diminished. There is a trade-off for this technique since sufficient contrast must remain in the image obtained by the overlay metrology tool which ensures the minimum signal to noise ratio to achieve required measurement precision. This trade-off is demonstrated in FIG. 16 which shows the effect on the Pattern Placement Error of perturbing the width of a single space in a 150/150 nm line/space periodic structure. The simulation results were achieved using PROLITH Tool Kit lithography simulation software from KLA-Tencor. The Scanner model used for this simulation was adopted for AT:1100 ArF TWINSCAN System of ASML (Wavelength 193 mm, NA=0.75, Sigma=0.25, conventional illumination source). The PPE were calculated for two aberration conditions: $3^{rd}$ order coma equal to 50 miliwaves and $3^{rd}+5^{th}$ order comas, each equal to 50 miliwaves.

Figure 16:
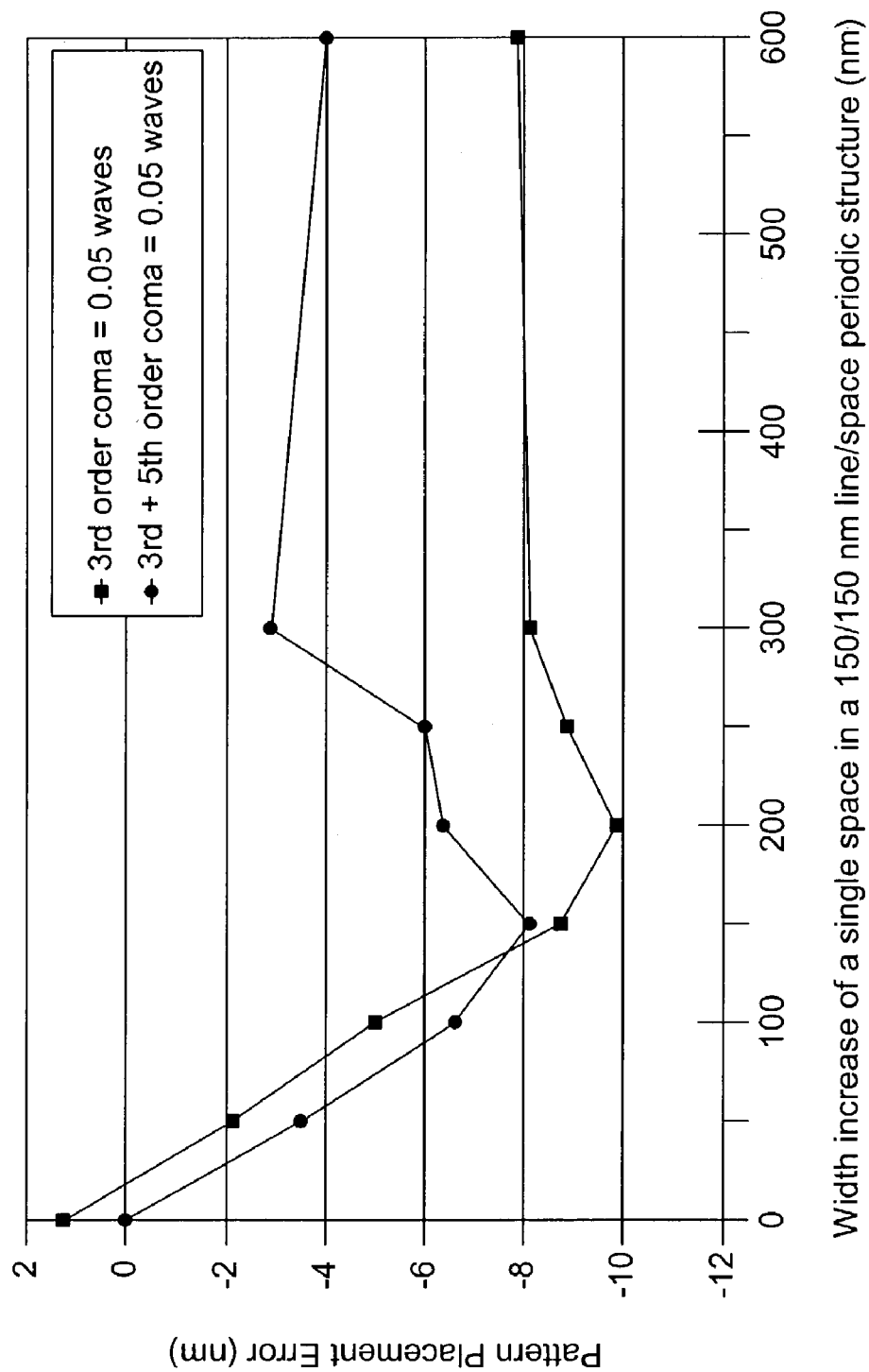
FIG. 16 is a graphical plot of pattern placement error, in accordance with one embodiment of the present invention.
Figure 17:
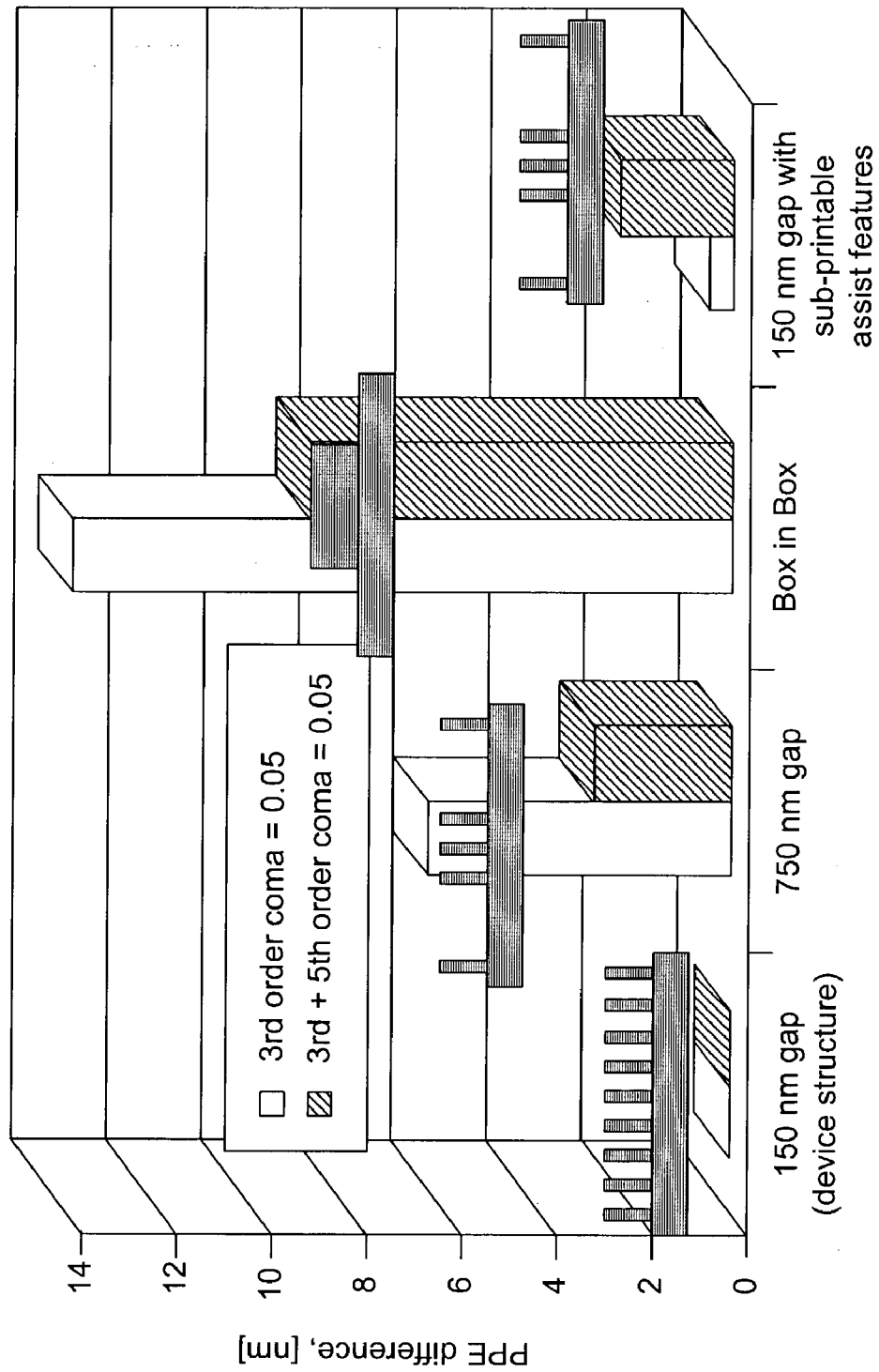
FIG. 17 is a graphical plot of pattern placement error relative to periodic device representing structure, in accordance with one embodiment of the present invention.

An additional methodology that can be used to diminish the perturbation due to the coarse structure which is added in order to achieve contrast in the metrology tool image is the application of optical proximity corrections. The idea is to construct the target in such way so as to minimize perturbation in the Fourier domain. As an example, the addition of sub printable scatter bars within the space opened up inside the coarse periodic structure at the same pitch as the device representing periodic structure with differing duty cycle, can also diminish the pattern placement error perturbation while maintaining reasonable metrology image contrast. FIGS. 16 and 17 illustrate the implementation of this approach. The simulation results demonstrated in FIG. 16 were calculated using the same ASML Scanner model described above. The results presented in FIG. 17 were simulated, using real process parameter adjusted to a known lithographic process. The Scanner parameters were: Wavelength 193 mm, NA=0.63, Sigma=0.87/0.57, annular illumination source. The PPE were calculated for two aberration conditions: $3^{rd}$ order coma equal to 50 miliwaves and $3^{rd}+5^{th}$ order comas, each equal to 50 miliwaves.

Referring to FIGS. 11-14, several overlay targets 170A-D in conjunction with the description above are shown. Each of these overlay targets 170 is similar to the overlay target shown in FIG. 7. As shown, each overlay target 170 contains eight working zones 172. The working zones 172 may be located in either a first layer or a second layer. The first layer is generally processed using a first set of lithographic parameters (L1), and the second layer is generally processed using a second set of lithographic parameters (L2). Each of the working zones 172 includes a periodic structure 174. The periodic structures 174 within the working zones 172 may be process robust structures (PRS) or device representing structures (DRS).

Figure 11:
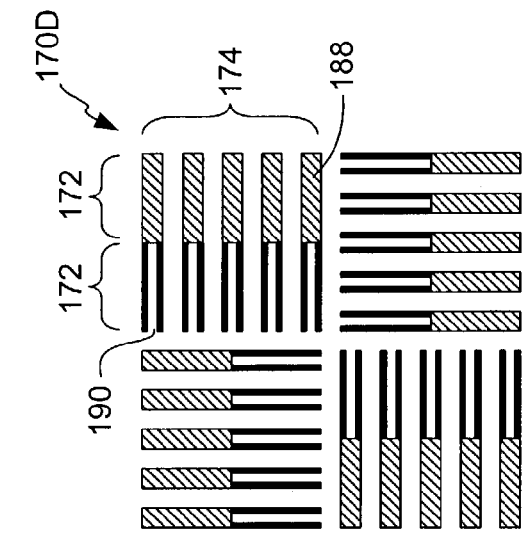
FIG. 11 is a top plan view of an overlay target, in accordance with one embodiment of the present invention.

FIG. 11 is a calibration overlay target 170A, i.e., a target that is used during calibration to form calibration data, in accordance with one embodiment of the present invention. The calibration overlay target 170A comprises a L2 DRS periodic structure 176 in the outer working zone and a L2 PRS periodic structure 178 in the inner working zone. During calibration, target 170A is typically measured at device and scribeline locations. Although not a requirement, this target is typically placed on a resist only wafer, i.e., not fully processed.

Figure 12:
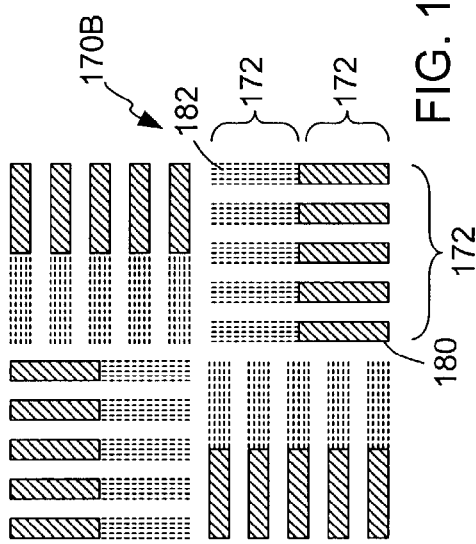
FIG. 12 is a top plan view of an overlay target, in accordance with one embodiment of the present invention.

FIG. 12 is another example of a calibration overlay target 170B, in accordance with one embodiment of the present invention. The calibration overlay target 170B comprises a L1 PRS periodic structure 180 in the outer working zone and a L1 DRS periodic structure 182 in the inner working zone. During calibration, target 170B is typically measured at device and scribeline locations. Although not a requirement, this target can typically be placed on either a resist only wafer or a fully processed wafer for this particular layer only.

Figure 13:
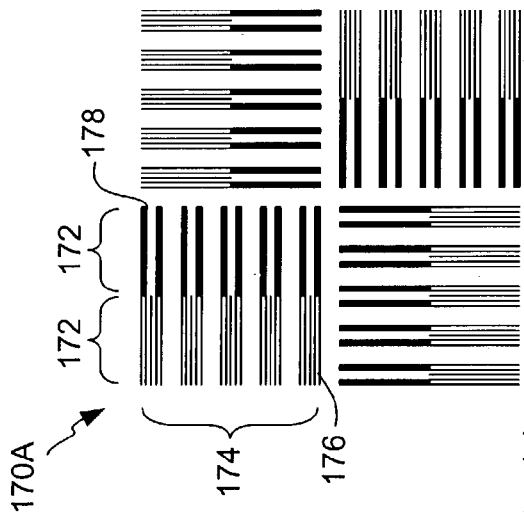
FIG. 13 is a top plan view of an overlay target, in accordance with one embodiment of the present invention.

FIG. 13 is an example of a calibration overlay target 170C, in accordance with one embodiment of the present invention. The calibration target 170C comprises a L1 DRS periodic structure 184 in the outer working zone and a L2 DRS periodic structure 186 in the inner working zone. During calibration, target 170C is typically measured at device and scribeline locations. This target may be a validation target as well. Validation targets are typically not used for calibration but for verification of the OVL value obtained from L1 and L2 structures and that can be corrected at all locations.

Figure 14:
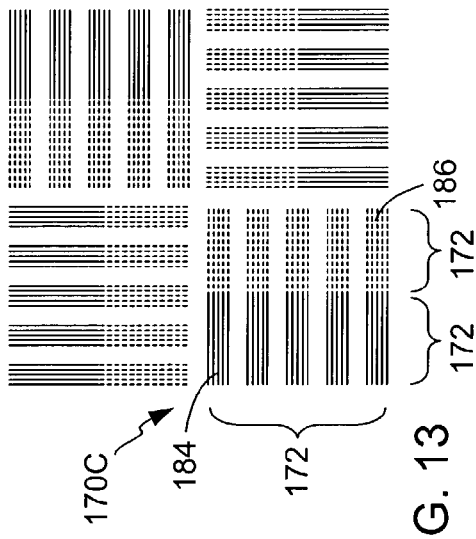
FIG. 14 is a top plan view of an overlay target, in accordance with one embodiment of the present invention.

FIG. 14 is an example of a production overlay target 170D, i.e., a target that is used during production to measure overlay, in accordance with one embodiment of the present invention. The production overlay target 170D comprises a L1 PRS periodic structure 188 in the outer working zone and a L2 PRS periodic structure 190 in the inner working zone. By way of example, the L1 PRS periodic structure may be formed using a first set of lithographic parameters, and the L2 PRS periodic structure may be formed using a second set of lithographic parameters. During production, target 170D is typically measured only at scribeline locations. This target may be an anchor target. Anchor targets are targets that are not very sensitive to the higher aberration orders.

In one embodiment, and referring to FIGS. 11-14, the L1 DRS periodic structures generally represents the most device representing structure for layer 1, i.e., a structure that best mimics what is actually happening with a device located on layer 1, and L1 PRS periodic structure generally represents the most process robust structure, i.e., a structure that best withstands the process used on layer 1. Additionally, the L2 DRS periodic structure generally represents the most device representing structure for layer 2, i.e., a structure that best mimics what is actually happening with a device located on layer 1, and L2 PRS periodic structure generally represents the most process robust structure, i.e., a structure that best withstands the process used on layer 2. The DRS periodic structures may include finely segmented lines as shown.

Figure 15:
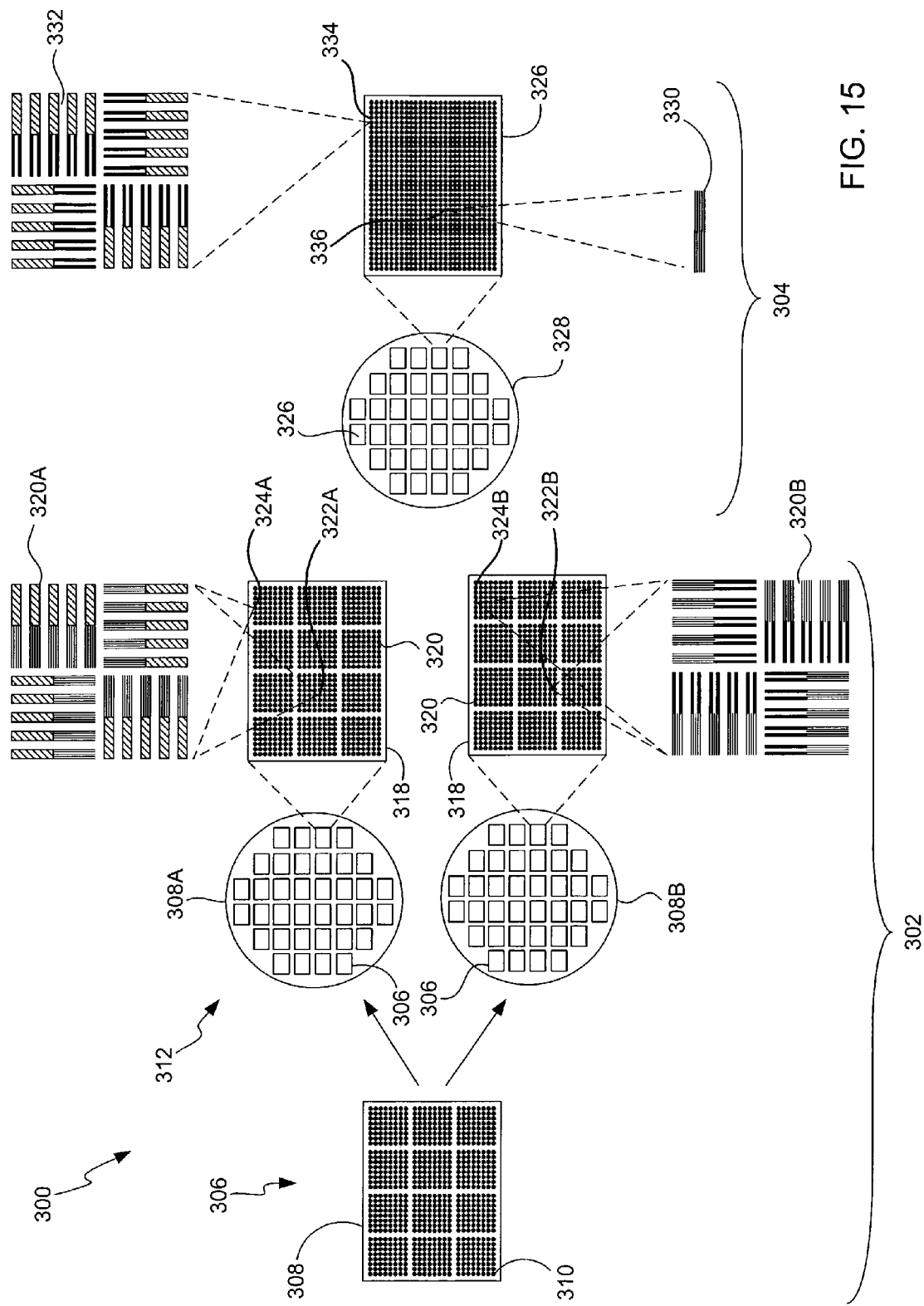
FIG. 15 is a schematic presentation of an exemplary method of monitoring overlay, in accordance with one embodiment of the present invention.

FIG. 15 is a schematic presentation of an exemplary method of monitoring overlay 300, in accordance with one embodiment of the present invention. By way of example, the method 300 may generally correspond to the methods described above. The method 300 generally consists of a calibration mode 302 and a production mode 304. The calibration mode 302 is configured to produce overlay calibration data that may be used in the production mode 304 to better predict the overlay error of device structures formed during the production mode 304, i.e., the calibration data is used to correct the overlay error measured in the production mode. The calibration mode 302 is typically conducted before the production mode 304.

The calibration mode 302 begins by forming one or more test dies 306 on one or more test wafers 308. This is generally accomplished with test reticles whose patterns are repeatedly printed on the test wafers 308 (e.g., resist/resist wafers). As should be appreciated, each of the test dies 306 contains a plurality of targets 320 that correspond to the target patterns located on the test reticles. The reticle patterns are typically printed on a plurality of test wafers 308 using different lithographic parameters. In the illustrated embodiment, the reticle patterns are printed on a first test wafer 308A using a first set of lithographic parameters and the reticle patterns are printed on a second test wafer 308B using a second set of lithographic parameters. The lithographic parameters generally correspond to the parameters that would be used during production for various layers of the device. For example, the first set of lithographic parameters may be used to form reticle patterns in a first layer (L1) and the second set of parameters may be used to form reticle patterns in a second layer (L2). The reticle patterns printed on each of these wafers may or may not be from the same test reticles. Although only two wafers are shown, it should be noted that this is not a limitation and that any number of test wafers 308 may be used.

The printed targets 320 within each of the test dies 306 may be widely varied. For example, they may be anyone of the previously mentioned targets. In the illustrated embodiment, the targets correspond to the style of targets shown in FIGS. 11-14. Anyone of these targets may be used (e.g., PRS vs. PRS, PRS vs. DRS, DRS vs. DRS, etc.). However, in most cases, the PRS vs. DRS targets are used. As shown, the first test wafer 308A includes at least a first set of targets 320A, and the second test wafer 308B includes at least a second set of targets 320B. By way of example, the first set of targets 320A may correspond to the target shown in FIG. 11 and the second set of targets 320B may correspond to the target shown in FIG. 12.

After printing the targets, the targets are measured. The measurements are typically performed using conventional techniques that are well known. As shown, the targets are measured at device and scribeline locations 322 and 324, respectively.

The production mode 304, on the other hand, generally begins by forming one or more production dies 326 on a production wafer 328. This is generally accomplished with production reticles whose patterns are repeatedly printed across the production wafer 328. Each of the production dies 326 contains one or more device structures 330 and one or more targets 332 that correspond to patterns located on the production reticles. The device structures are typically used to build a device, i.e., an integrated circuit, while the targets are typically used to ensure that the relative position of the device structures on adjacent layers are within desired limits. As shown, the targets 332 are placed around the periphery of the production dies 326, as for example, in the scribeline. The production dies 326 are typically formed in various layers on the production wafer 328 using multiple production reticles and multiple lithographic parameters. In the illustrated embodiment, a first die pattern is formed in a first layer (L1) using a first set of lithographic parameters and a second die pattern is formed in a second layer (L2) using a second set of lithographic parameters. In most cases, the lithographic parameters used in the calibration mode are similar to the lithographic parameters used in the production mode.

The printed targets 332 within each of the production dies 326 may be widely varied. For example, they may be any one of the previously mentioned targets. In the illustrated embodiment, the targets correspond to the style of targets shown in FIGS. 13-16. Anyone of these targets may be used (e.g., PRS vs. PRS, PRS vs. DRS, DRS vs. DRS, etc.). However, in most cases, the PRS vs. PRS targets are used since they are robust to the process, i.e., the first PRS is robust to the process used to form the first layer (L1) and the second PRS is robust to the process used to form the second layer (L2). In one embodiment, the PRS vs. PRS target comprises a first PRS corresponding to the PRS used on the first test wafer, and a second PRS corresponding to the PRS used on the second test wafer. By way of example, the target may correspond to the target shown in FIG. 14.

After forming the production dies 326, the targets 332 in the scribeline 334 are measured. The measurements are typically performed using conventional techniques that are well known. After measuring the targets 332, the production measurements are compared with the calibration measurements in order to determine the overlay error of a device structure 330 at a device location 336. As should be appreciated, the location of the calibration targets generally correspond to the location of the production target 332 and device structure 330, and therefore the calibrated measurements may be used to correct the production measurements. This is generally accomplished by performing a conversion as described in FIG. 5.

In one embodiment of the invention, a dense mark cluster measurement sequence may be performed by the metrology tool in order to reduce the time of measuring when measuring a great number of different of similar overlay marks. The dense mark cluster measurement sequence generally allows the user of the metrology tool to reduce the time of measuring by skipping the acquisition of and focus on the overlay mark by knowing the distance between the overlay marks in the cluster. The dense mark cluster measurement sequence is typically determined during the recipe train, i.e., the metrology tool is walked through a series of measurement steps from one overlay mark to another. The size of the dense mark cluster as well as the maximum distance between overlay marks may be widely varied. Both of these factors generally depend on the metrology tool used to measure the overlay marks, i.e., these factors are tool specific. Although not a requirement, it is generally believed that the greater the distance between marks, the greater the loss in the accuracy of the measurements. As such, the maximum distance is typically small. By way of example, and not by way of limitation, the cluster size may be between about 2 and about 100 marks, and the max. distance may be about 2 mm. Again, these values are not a limitation and generally vary according to the design of the metrology tool.

Referring specifically to the dense mark cluster measurement sequence, the first mark in the cluster is acquired & focused and the others are measured by blind stepping from the center of one mark to the subsequent mark. By blind stepping it is generally meant that the metrology tool moves from one point on the wafer to another point of the wafer without performing an acquisition and/or focus step. As such, the time the metrology tool typically takes to acquire and re-focus is saved. By way of example, for a great number of metrology marks the method can save up to 90% per measurement position.

Figure 18:
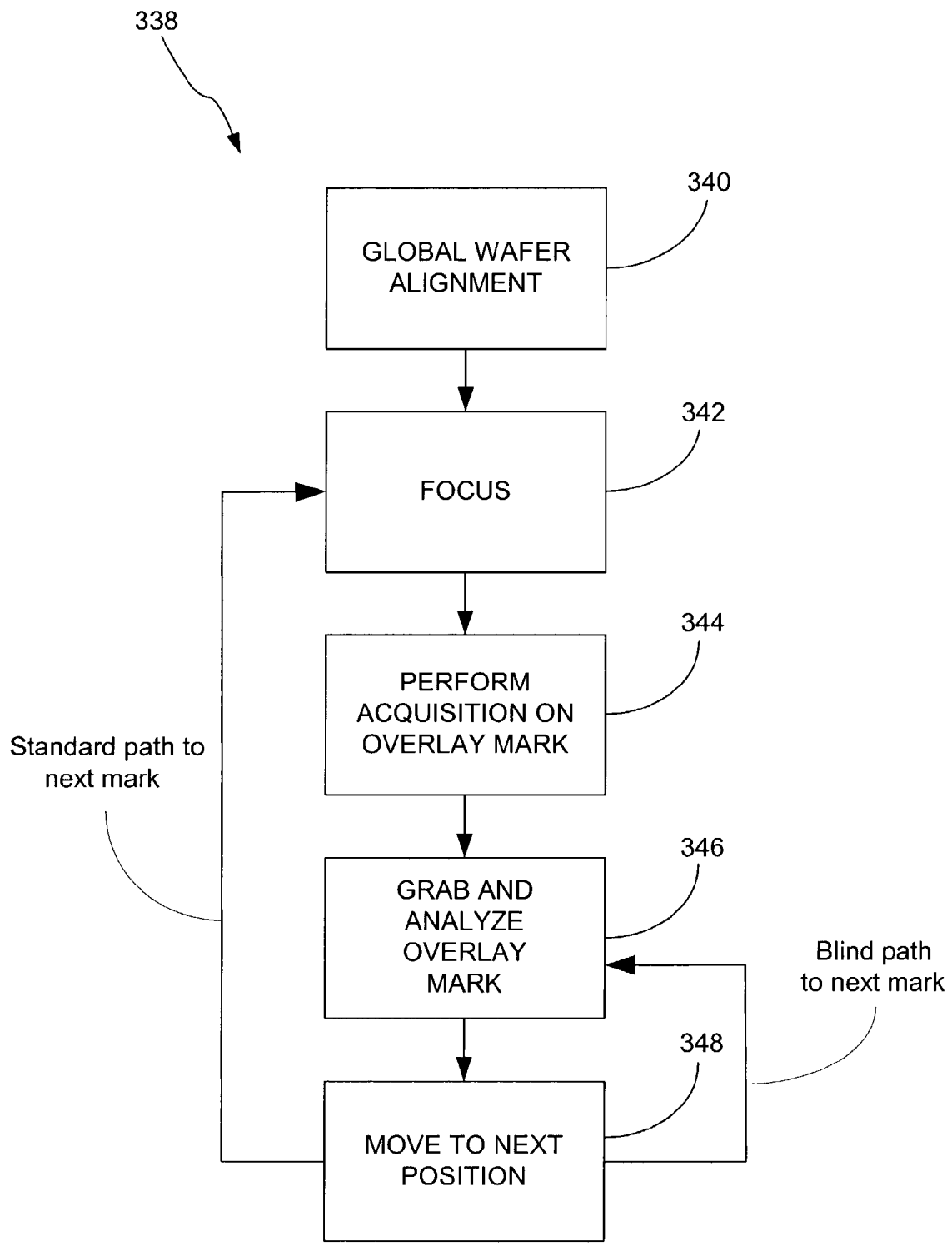
FIG. 18 is a flow diagram showing a measurement sequence, in accordance with one embodiment of the present invention.

FIG. 18 is a flow diagram showing a dense mark cluster measurement sequence 338, in accordance with one embodiment of the present invention. The measurement sequence 338 is typically performed on a metrology tool such as for example the Archer manufactured by KLA-Tencor of Milpitas, Calif. The measurements performed by the metrology tool may be based on techniques such as imaging, scanning, scatterometry and the like. The flow 338 generally begins at block 340 where a global wafer alignment is performed. Global wafer alignment generally refers to the procedure of determining the physical position of the wafer on the center of the chuck. This particular step is well known in the field and therefore will not be discussed in greater detail. Following block 340, the process flow proceeds to block 342 where the tool performs a focusing step. The focusing step is typically implemented to place the overlay mark in focus. For example, the tool is moved along the z axis until the surface of the wafer is in focus or within a specified value of focus. Following block 342, the process flow proceeds to block 344 where an acquisition step is performed on the overlay mark. The acquisition step generally refers to the procedure where the overlay mark is centered within the field of view of the metrology tool. This is generally accomplished by taking an image of the mark analyzing the position of the mark, and if need be repositioning the stage of the metrology tool in order to center the overlay mark within the field of view of the metrology tool. The focus and acquisition steps are well known and therefore will not be described in greater detail herein.

Following block 344, the process flow proceeds to block 346 where the overlay mark is grabbed by the metrology tool. Grabbing is a well known term in the art. It generally refers to the methodology where the overlay mark is measured and analyzed in order to determine the overlay error of the overlay mark. Although grabbing generally refers to measurement techniques related to imaging (e.g., taking a picture of the overlay mark), it should be noted that it also covers other techniques such as scanning, scatterometry and the like. Following block 346, the process flow proceeds to block 348 where the metrology tool is moved to the next position, i.e., the next measurement location.

Before moving to the next position as indicated in block 348, however, a decision is made as to whether or not the metrology tool is running in a standard mode or a dense mark cluster mode. If the metrology tool is running in the standard mode then the process flow proceeds to block 340. If the metrology tool is running in the dense mark cluster mode then steps 340-344 are skipped and the process flow proceeds to block 346. That is, after all steps are complete on the first mark (steps 340-348) the vector is calculated from the center of the metrology tool field of view to where the next mark in the cluster is positioned on the wafer (step 348). This may be referred to as running blind, i.e., no acquisition or focus steps are performed. At block 346, the next mark is grabbed at the same focus position (as the first mark). Blindly running through steps 346 and 348 continues until all the marks in the cluster have been grabbed. Thereafter, the process flow ends or proceeds back to block 340 where a new cluster can be processed by the metrology tool.

It should be noted that skipping both focus and acquisition is not a limitation and that only one of these steps may be skipped (while implementing the other) in order to save time during overlay measurements. It should also be noted that this methodology is not limited to overlay measurements and that it may be extended to other metrologies as for example critical dimension (CD), feature shape, topography (e.g., 3D), and the like.

In another embodiment, the metrology tool can, after a pre-defined time period DeltaT, refresh the acquisition and focusing step 342 to improve the accuracy of mark positioning of step 348. In another embodiment, the acquisition and focusing step 342 can be carried out after a pre-defined distance DeltaL has been reached between the previously acquired mark and the current mark in order to improve the accuracy of mark positioning. In yet another embodiment, a feed forward technique may be used to also save time. Feed forward generally refers to the technique of using information from the last step to modify the next step. In this embodiment, acquisition and/or focus may be performed using the grabbed image from a previous step.

In order to meet ever shrinking lithographic overlay control budgets, overlay metrology uncertainty should be quantified and minimized. Overlay metrology uncertainty generally refers to the variation found between the overlay error of the overlay mark and the actual overlay error of the device. One important contributor of this uncertainty is the impact of the patterning process on the fidelity or robustness of the overlay mark, i.e., the degree to which the patterning process accurately reproduces the overlay mark. By way of example, reticle errors and lithography errors associated with the patterning process have been found to impact the overlay mark fidelity (OMF) in a non-trivial manner.

In accordance with one embodiment, therefore, the overlay mark fidelity is evaluated so as to help quantify and reduce the overlay metrology uncertainty. The evaluation is generally accomplished by measuring the overlay error of an array of nominally identical overlay marks that are closely placed relative to one another. After compensating for metrology tool induced sources of uncertainty, all the overlay marks within the array should, in principle, give the same overlay value. If, however, they do not give the same value then the overlay mark fidelity may be a non-negligible source of overlay metrology uncertainty. As should be appreciated, overlay mark fidelity tends to vary with mark design and location on the wafer. In one implementation, the desired overlay mark fidelity is defined as three times (3x) the standard deviation of the overlay error found in the array of overlay marks, i.e., the overlay error distribution of a group of densely packed overlay marks. It should be noted, however, that this is not a limitation and that other metrics may be used to determine the overlay mark fidelity. For example, other estimators of the tightness of the distribution of the overlay results may be used.

Figure 19:
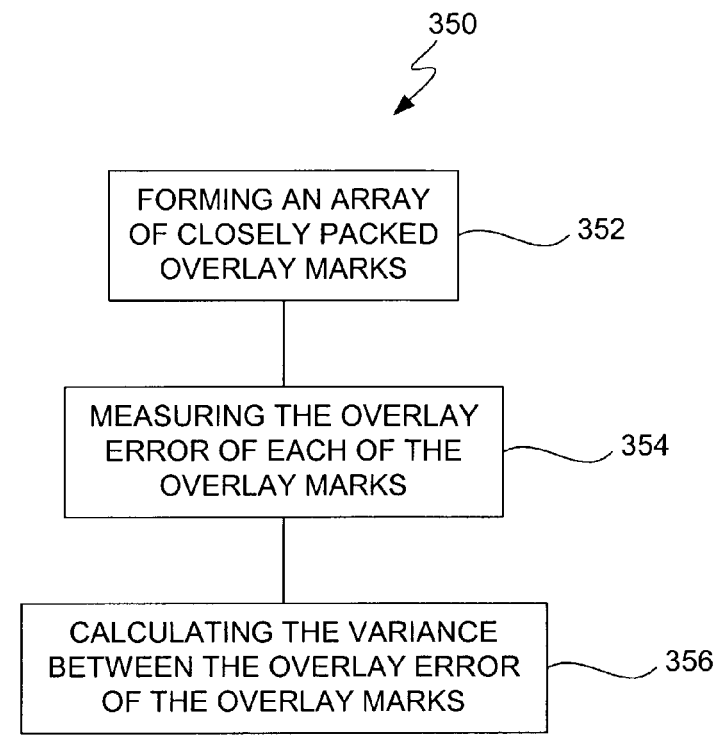
FIG. 19 is a flow diagram of a fidelity determining method, in accordance with one embodiment of the present invention.

FIG. 19 is a flow diagram of a fidelity determining method 350, in accordance with one embodiment of the present invention. The fidelity determining method 350 is generally configured to determine the robustness or fidelity of a given overlay mark. The overlay mark may be widely varied. By way of example, the overlay mark may correspond to conventional box in box (or related box marks) or they may correspond to periodic structures such as those found in U.S. patent application Ser. No. 09/894,987 to Ghinovker et al., titled "Overlay Marks, Methods of Overlay Mark Design and Methods of Overlay Measurements", filed on Jun. 27, 2001, which is hereby incorporated by reference (or equivalents thereof).

The method generally begins at block 352 where an array of closely packed overlay marks are formed. By closely packed, it is generally meant that the overlay marks are placed close enough together that the impact of processing conditions that vary over a wide area are negligible, i.e., there is not much variation therebetween. By way of example, the overlay marks may be positioned about 1 to about 20 microns apart from each other. In most cases, the overlay marks are formed on a test wafer using conventional wafer processing techniques. In one implementation, the overlay marks are printed on two layers. In another implementation, the overlay marks are printed on a single layer. The later implementation has the advantage of reducing the variables that may effect the overlay mark fidelity, i.e., a single reticle and a single processing step rather than possibly two reticles and two processing steps as in the first implementation.

Following block 352, the process flow proceeds to block 354 where the overlay error of each of the overlay marks is measured. This may be accomplished using any suitable overlay measurement technique, as for example, imaging, scanning, scatterometry or the like.

Following block 354, the process flow proceeds to block 356 where the variance between the overlay error of the overlay marks is calculated. The variance generally refers to the variation found between the overlay error of the overlay marks located in the array. The variation may be found using any suitable technique. As should be appreciated, if the variation is within desired limits, then the overlay mark may be considered to work well with the given process conditions. In addition, if the variation is not within desired limits, then the overlay mark may be considered to not work well with the given process conditions.

Figure 20:
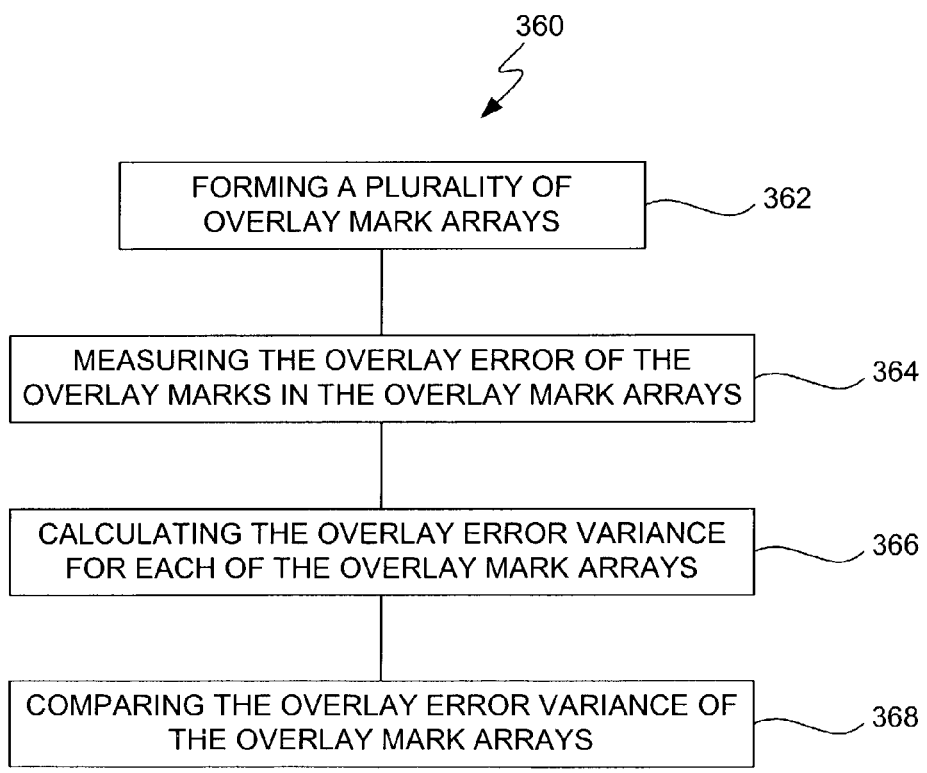
FIG. 20 is a flow diagram of an overlay mark selection method, in accordance with one embodiment of the present invention.

FIG. 20 is a flow diagram of an overlay mark selection method 360, in accordance with one embodiment of the present invention. The overlay mark selection method 360 is generally configured to select the most process robust overlay mark for a given set of process conditions, i.e., to find one or more overlay marks that works best for the given process conditions. The overlay marks may be widely varied. By way of example, the overlay marks may correspond to conventional box in box (or related box marks) or they may correspond to periodic structures such as those found in U.S. patent application Ser. No. 09/894,987 to Ghinovker et al., titled "Overlay Marks, Methods of Overlay Mark Design and Methods of Overlay Measurements", filed on Jun. 27, 2001, which is hereby incorporated by reference (or equivalents thereof).

The method generally begins at block 362 where a plurality of overlay mark arrays are formed. Each of the overlay mark arrays includes two or more closely packed and identical overlay marks. By way of example, the overlay mark arrays may include a 1×1 array, 2×2 array, 4×4 array, 8×8 array and the like. Asymmetrical arrays may also be used. For example, 1×2, 2×4, 4×8 and the like. The overlay mark arrays are generally formed with different overlay marks. For example, a first overlay mark array may include a first type of overlay mark and a second overlay mark may include a second type of overlay mark. The overlay marks may be formed on one or more test wafers using a predetermined set of process conditions.

Following block 362, the process flow proceeds to block 364 where the overlay error of the overlay marks in the overlay mark arrays is measured. This may be accomplished using any suitable overlay measurement technique, as for example, imaging, scanning, scatterometry or the like.

Following block 364, the process flow proceeds to block 366 where the overlay error variance for each of the overlay mark arrays is calculated. This is similar to block 356 in FIG. 19, however, the calculation is performed for each one of the arrays.

Following block 366, the process flow proceeds to block 368 where the overlay error variance of the overlay mark arrays are compared. The overlay marks from the overlay mark array with the least amount of overlay variance is generally believed to yield the most process robust mark for the given overlay mark arrays. For example, if a first overlay mark array has a large variance as compared to a second overlay mark array then the overlay mark contained in the second overlay mark array is generally believed to work better than the overlay mark contained in the first overlay mark array for the given process conditions. That is, the second overlay mark is more process robust than the first overlay mark.

Figure 21:
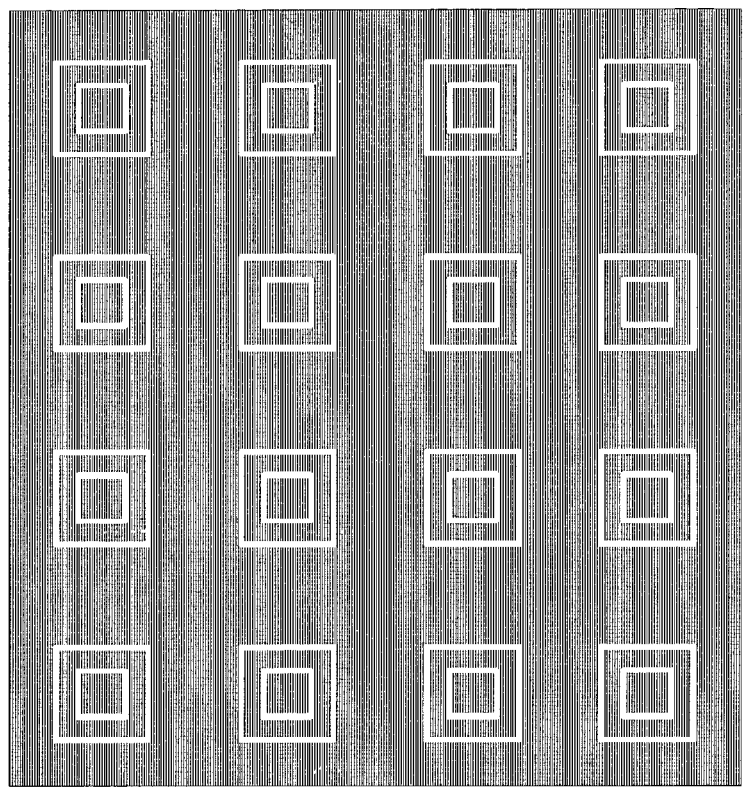
FIG. 21 is a diagram of an overlay mark fidelity array, in accordance with one embodiment of the present invention.
Figure 21:
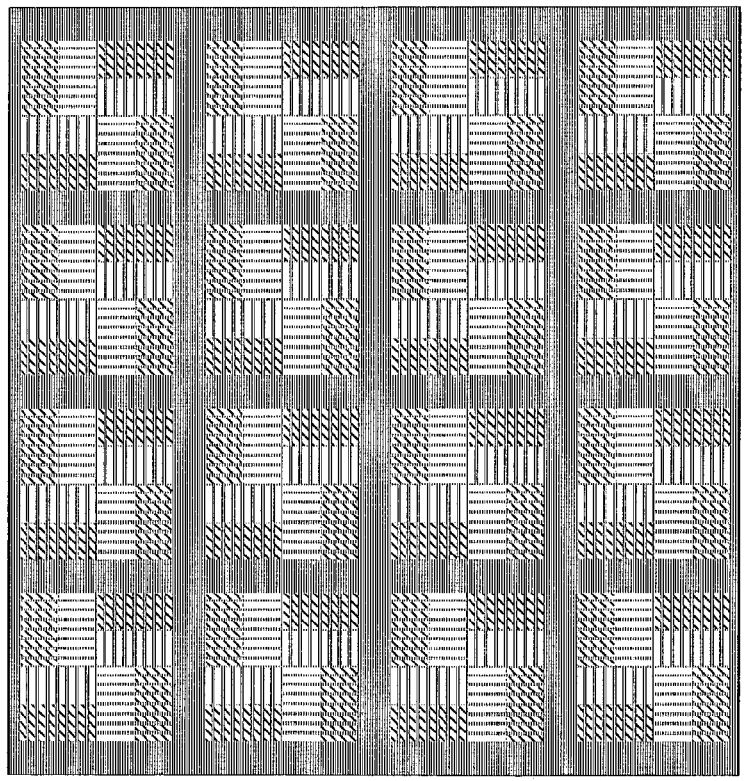
Figure 22:
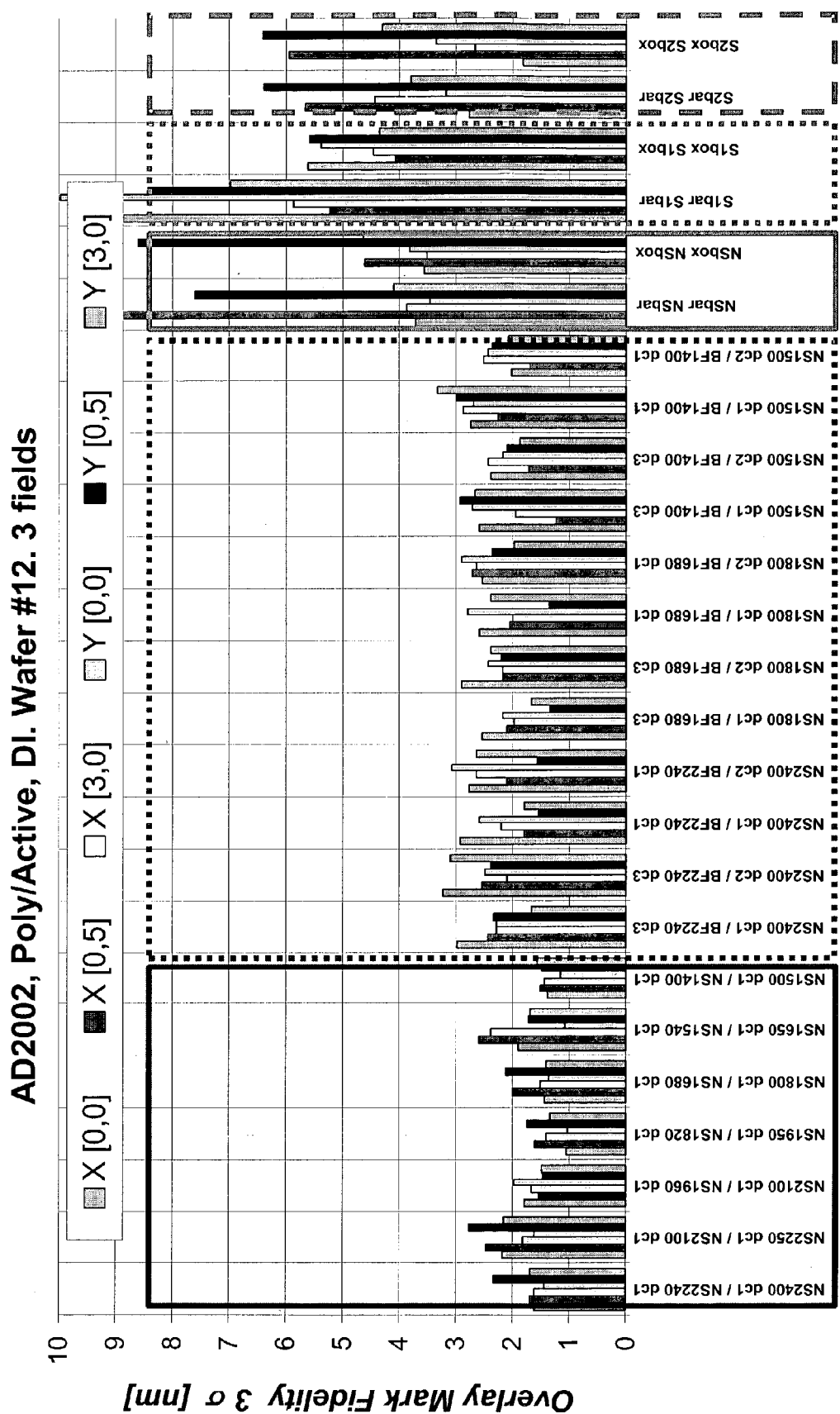
FIG. 22 is a graph showing results obtained on both box in box and newer targets, in accordance with one embodiment of the present invention.

Examples of overlay mark fidelity arrays and results obtained on both box in box and newer targets are shown in FIGS. 21 and 22.

Furthermore, OMF (overlay mark fidelity) may be defined as 3 times the standard deviation of N overlay measurement results from an array of N identical marks printed in close proximity. By design, it is expected that these N measurements will produce identical overlay results. However in reality, due to process effects, a distribution of overlay readings is resultant. In this context, "process effects" refer to the sequence of steps starting with reticle manufacture and ending in a topographically complex structure on the wafer in which the overlay mark contains information from two different process layers. The distribution, quantified by OMF, is an important component of the overlay metrology error, which is independent of the traditional metrology uncertainty contributors, i.e. precision, TIS (Tool Induced Shift) and TIS variability. The OMF is computed from the overlay results from the array after compensating for the above-mentioned metrology tool-induced sources of uncertainty.

Specifically, let i be an index of the target number within an array of N adjacent targets. Let j be an index of the field number from F fields on a wafer of index k in a lot of W wafers. Let $OVL\_X_{ijk}$ and $OVL\_Y_{ijk}$ be the overlay in the X and Y directions respectively for target i, in field j and on wafer k. The OMF of the field j on wafer k is therefore defined as:

$$OMF_{jk} = 3 * \left( \frac{\sum_{i=1}^{N} OVL\_X_{ijk}^2 - \frac{\left(\sum_{i=1}^{N} OVL\_X_{ijk}\right)^2}{N}}{N-1} \right)^{1/2}$$

It is generally assumed that of the W wafers in the lot, all were processed with the same reticle set, but with arbitrary process parameters. For a given wafer k, the pooled OMF is estimated by:

$$OMF_k = 3 * \left( \frac{\sum_{j=1}^{F} (OMF_{kj}/3)^2}{F} - \frac{S^2\_pooled\_precison}{N\ dynamic\_loops} \right)^{1/2}$$

The dynamic precision S of an individual measurement is typically 5 fold smaller than the OMF so that this correction is small, but is included for rigor. The next step in the analysis is to extract the component of this statistical estimator, which is constant for all arrays on all fields and all wafers, from the component that varies from array to array. The array independent component is attributed to the mask error, defined as:

$$ME_i = \overline{OVL_i} - \frac{\sum_{i=1}^{N} \overline{OVL_i}}{N}$$

where the mean target overlay is calculated as follows:

$$\overline{OVL_i} = \frac{\sum_{k=1}^{W}\sum_{j=1}^{F} OVL\_X_{ijk}}{W*F}$$

The reticle overlay mark fidelity can them be estimated by the statistic:

$$OMF_{reticle} = 3 * \left( \frac{\sum_{i=1}^{N} ME_i^2 - \frac{\left(\sum_{i=1}^{N} ME_i\right)^2}{N}}{N-1} \right)^{1/2}$$

Finally, the process contribution are estimated by calculating the "random" component on an array-by-array basis, after correcting for the mask error. Corrected overlay is then defined as:

$$OVL\_X\_Corrected_{ijk} = OVLX_{ijk} - ME_i$$

Accordingly, the random or process OMF contribution is estimated in the same way as field OMF, where OVL_X is replaced with OVL_X_Corrected. In this way it is possible to separate the process contribution from the reticle contribution of the overlay mark fidelity. As a final sanity check, the reticle contribution can be calculated on a wafer by wafer basis, i.e., replace $ME_i$ with $ME_{ik}$ and sum only over fields. To within reasonable statistical limits this parameter should yield identical results on all wafers.

We present the results of such measurements on various marks, which were produced in a number of different process layer combinations, and patterned using a DUV scanner. The same reticle set was used to pattern wafers on different process layers and process conditions. As described above, by appropriate statistical analysis, the breakdown of the total OMF into a reticle-induced OMF component and a random OMF component was facilitated. We compare the OMF of traditional box-in-box overlay marks and of new grating-based overlay marks. The reticle-induced OMF showed an improvement of 30% when using the new grating-based overlay mark. Furthermore, in a series of wafers run through an STI-process with different CMP times, the random component of the OMF of the new grating-based overlay mark was observed to be 50% less sensitive to process variation compared with Box in Box marks. This shows that the new grating-based overlay mark is more robust against CMP-process variations than the traditional box-in-box overlay mark.

Figure 23A:
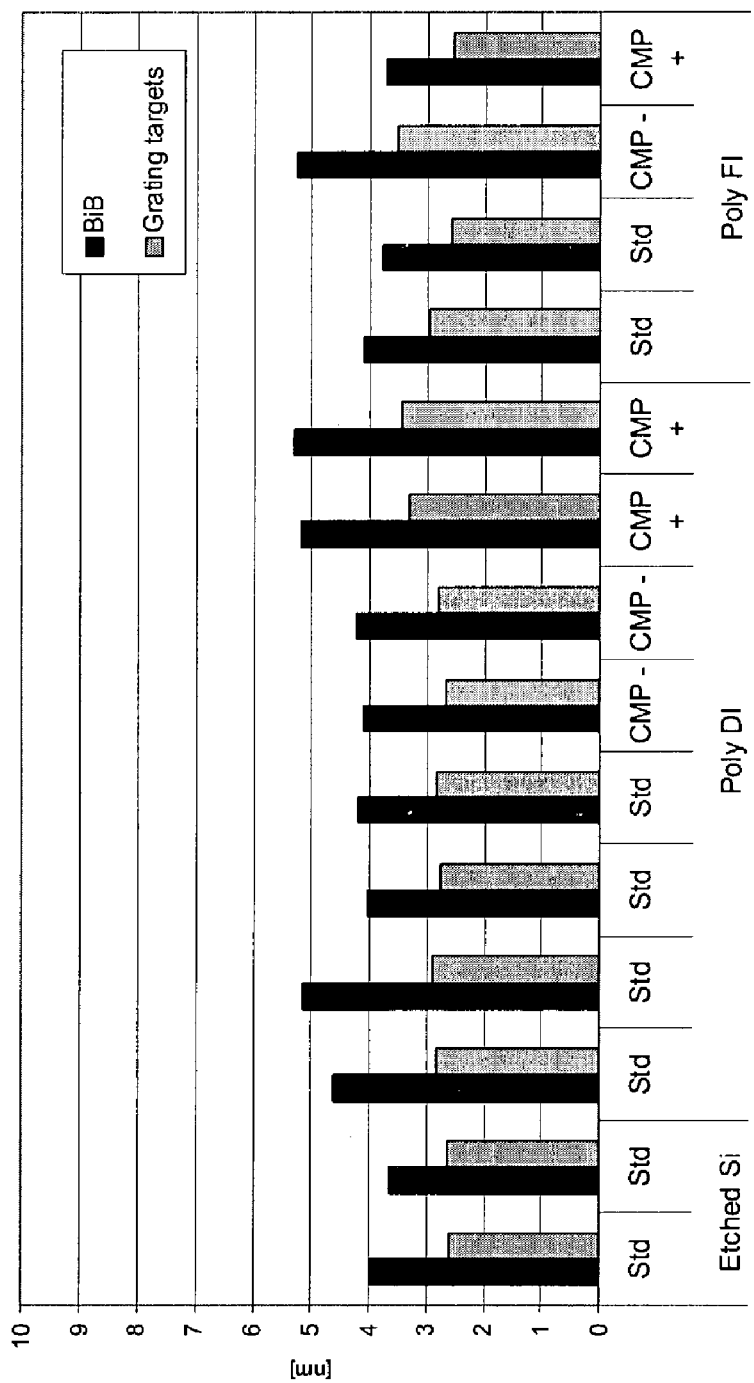
FIGS. 23A-C are illustrations showing the results of the breakdown between reticle and random (process) components of OMF, in accordance with one embodiment of the present invention.
Figure 23B:
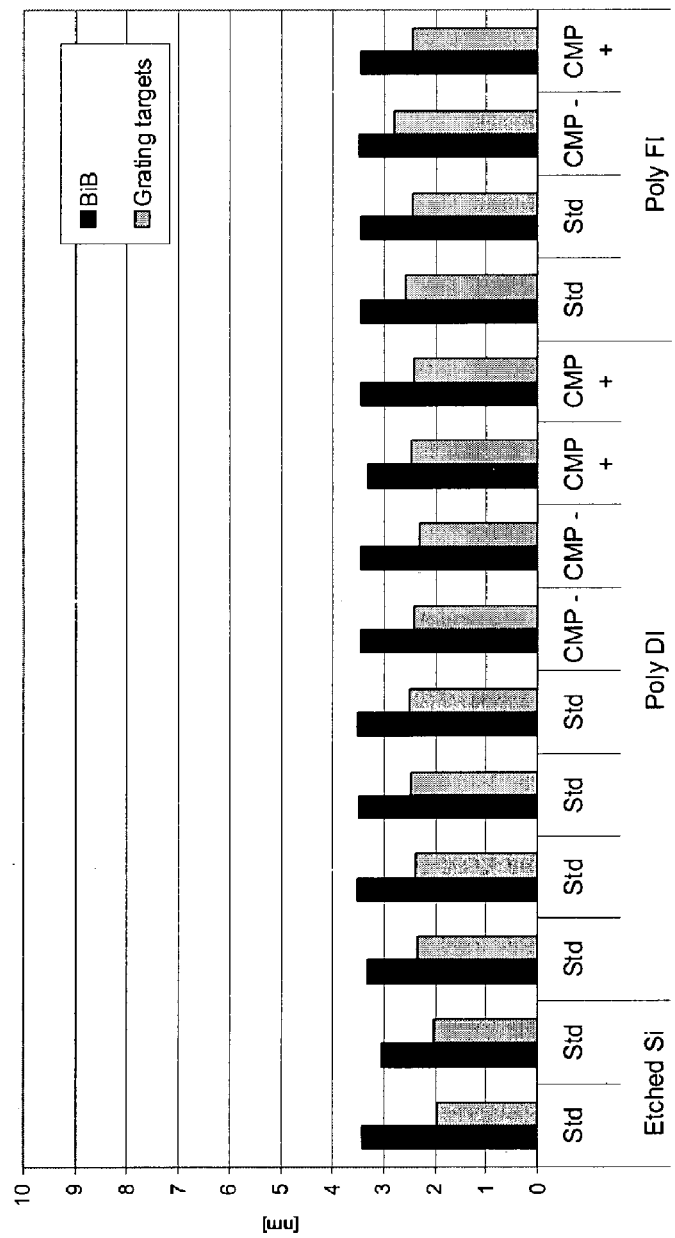
Figure 23C:
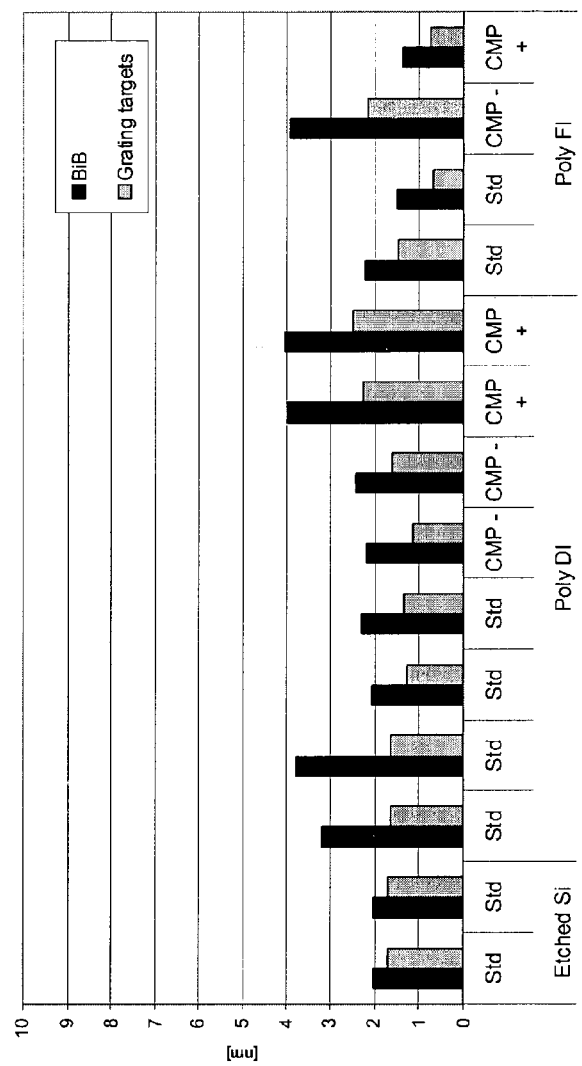

FIGS. 23A-C are illustrations showing the results of the breakdown between reticle and random (process) components of OMF.

While this invention has been described in terms of several preferred embodiments, there are alterations, permutations, and equivalents, which fall within the scope of this invention. For example, while the above description refers generally to overlay mark fidelity characterization, it should be appreciated that the reticle and process fidelity contributions of any metrology mark can be characterized by this method, for instance CD metrology marks or other parametric metrology and inspection marks used in microelectronic manufacturing. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. An overlay method for determining the overlay error of a device structure formed during semiconductor processing, comprising:
    for a first set of process conditions, producing calibration data that specifies a relative difference between an overlay error of a first target at a first location of a test wafer and a second target at a second location of the test wafer, wherein the first location corresponds to a location on a production wafer that is outside a die area of a production wafer and the second location corresponds to a location that is inside the die area of the production wafer;
    measuring an overlay error of a production target that is located approximately at the first location that is outside the die area on a production wafer formed with the given set of process conditions, wherein the production wafer also includes a device structure that is located approximately at the second location within the die area of the production wafer; and
    determining an overlay error of the device structure by adjusting the overlay error, which was measured for the production target, by the relative difference between the overlay errors of the first and second targets of the test wafer as specified in the calibration data, wherein the overlay error of the device structure is determined without measuring an overlay error on the device structure.

2. The method as recited in claim 1 wherein the configuration of the production target is similar to the first target.

3. The method as recited in claim 1 wherein the calibrated data is obtained experimentally by forming two or more targets at various locations on a test wafer for a given set of process conditions; measuring the overlay error of the targets; and correlating the overlay error between different targets at different locations for the given set of process conditions.

4. The method as recited in claim 3, wherein the overlay errors are measured using scatterometry techniques.

5. The method as recited in claim 3, wherein the overlay errors are measured using imaging or scanning overlay measurement techniques.

6. The method as recited in claim 1, wherein the first target is a process robust target and the second target is a device representing target.

7. The method as recited in claim 6, wherein the process robust target is a box in box target.

8. The method as recited in claim 6, wherein the process robust target is a periodic structure.

9. The method as recited in claim 1, wherein the first location of the first target corresponds to a scribe line of the production wafer.

10. The method as recited in claim 1, wherein the first and second targets are process robust targets.

11. The method as recited in claim 1, wherein the first and second targets are device representing targets.

12. The method as recited in claim 1, wherein one of the targets of the first and second targets corresponds to a process robust target and the other of the first and second targets corresponds to a device representing target.

13. The method as recited in claim 1, wherein the production target is a process robust target.

14. The method as recited in claim 1, wherein the production target is a device representing target.

15. The method as recited in claim 13, wherein the overlay error of the device structure at approximately the second location in the die area is further determined by: converting the process robust target located at approximately the first location to a virtual device representing target at approximately the first location using the calibration data; converting the virtual device representing target located at approximately the first location to a virtual device representing target at approximately the second location using the calibrated data; calculating the overlay error of the virtual device representing target at approximately the second location using the calibration data so as to determine the overlay error of the device structure.

16. The method as recited in claim 1, wherein the calibration data is produced from simulation results of the first and second targets of the test wafer.

\* \* \* \* \*